US008907378B2

(12) United States Patent
Teo et al.

(10) Patent No.: US 8,907,378 B2
(45) Date of Patent: Dec. 9, 2014

(54) HIGH ELECTRON MOBILITY TRANSISTOR WITH MULTIPLE CHANNELS

(71) Applicant: Mitsubishi Electric Research Laboratories, Inc., Cambridge, MA (US)

(72) Inventors: Koon Hoo Teo, Lexington, MA (US); Peijie Feng, Syracuse, NY (US); Rui Ma, Somerville, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 13/833,864

(22) Filed: Mar. 15, 2013

(65) Prior Publication Data
US 2014/0266324 A1  Sep. 18, 2014

(51) Int. Cl.
| H01L 29/739 | (2006.01) |
| H01L 31/0328 | (2006.01) |
| H01L 31/0336 | (2006.01) |
| H01L 31/072 | (2012.01) |
| H01L 31/109 | (2006.01) |
| H01L 29/778 | (2006.01) |
| H01L 29/20 | (2006.01) |

(52) U.S. Cl.
CPC ........ *H01L 29/7787* (2013.01); *H01L 29/2003* (2013.01)
USPC 257/194; 257/195; 257/E29.11; 257/E29.19; 257/E29.246; 257/E29.247; 257/E29.248; 257/E29.249; 257/E29.25; 257/E29.251; 257/E29.252; 257/E29.253; 257/E29.254

(58) Field of Classification Search
USPC ...................... 257/194, 195, E29.11, E29.19, 257/E29.246, E29.247, E29.248, E29.249, 257/E29.25, E29.251, E29.252, E29.253, 257/E29.254
See application file for complete search history.

(56) References Cited

U.S. PATENT DOCUMENTS

| 4,821,093 | A | * | 4/1989 | Iafrate et al. ................... 257/194 |
| 5,151,758 | A | * | 9/1992 | Smith ............................ 257/287 |
| 5,446,296 | A | * | 8/1995 | Nakajima ..................... 257/194 |
| 5,473,175 | A | * | 12/1995 | Nikaido et al. ................ 257/192 |
| 5,485,018 | A | * | 1/1996 | Ogawa et al. .................... 257/24 |
| 5,561,305 | A | * | 10/1996 | Smith ............................ 257/194 |
| 5,742,077 | A | * | 4/1998 | Patel et al. ..................... 257/194 |
| 5,789,771 | A | * | 8/1998 | Liu et al. ....................... 257/287 |
| 5,945,693 | A | * | 8/1999 | Suzuki et al. ................. 257/192 |
| 6,366,085 | B1 | * | 4/2002 | Yeshurun et al. ............. 324/263 |
| 7,268,374 | B2 | * | 9/2007 | See et al. ....................... 257/188 |

(Continued)

FOREIGN PATENT DOCUMENTS

JP   02192740 A  *  7/1990

*Primary Examiner* — Ida M Soward
(74) *Attorney, Agent, or Firm* — Dirk Brinkman; Gene Vinokur

(57) ABSTRACT

A device includes a source and a drain for transmitting and receiving an electronic charge. The device also includes a first stack and a second stack for providing at least part of a conduction path between the source and the drain, wherein the first stack includes a first gallium nitride (GaN) layer of a first polarity, and the second stack includes a second gallium nitride (GaN) layer of the second polarity, and wherein the first polarity is different from the second polarity. At least one gate operatively connected to at least the first stack for controlling a conduction of the electronic charge, such that, during an operation of the device, the conduction path includes a first two-dimensional electron gas (2DEG) channel formed in the first GaN layer and a second 2DEG channel formed in the second GaN layer.

10 Claims, 24 Drawing Sheets

(56) References Cited

U.S. PATENT DOCUMENTS

| | | | |
|---|---|---|---|
| 7,884,394 B2* | 2/2011 | Wu et al. | 257/194 |
| 8,519,438 B2* | 8/2013 | Mishra et al. | 257/192 |
| 8,624,667 B2* | 1/2014 | Teo et al. | 327/566 |
| 8,674,372 B2* | 3/2014 | Curatola et al. | 257/76 |
| 2007/0145347 A1* | 6/2007 | Katayama et al. | 257/9 |
| 2010/0117118 A1* | 5/2010 | Dabiran et al. | 257/190 |
| 2011/0297961 A1* | 12/2011 | Bunin et al. | 257/76 |
| 2012/0074476 A1* | 3/2012 | Kondo et al. | 257/295 |
| 2012/0267655 A1* | 10/2012 | Zhang et al. | 257/94 |
| 2013/0134443 A1* | 5/2013 | Terano et al. | 257/77 |
| 2013/0153967 A1* | 6/2013 | Curatola et al. | 257/194 |
| 2014/0110759 A1* | 4/2014 | Murata et al. | 257/194 |

\* cited by examiner

200

300

301

400

500

680

HIGH ELECTRON MOBILITY TRANSISTOR WITH MULTIPLE CHANNELS

FIELD OF THE INVENTION

The present invention relates generally to gallium nitride (GaN) based high electron mobility transistors (HEMTs), and more particularly to transistors with multiple conductive channels.

BACKGROUND OF THE INVENTION

High electron mobility transistor (HEMT), also known as heterostructure FET (HFET) or modulation-doped FET (MODFET) transistor, includes stacked semiconductor layers. The thicknesses, arrangement and materials of the layers vary among different types of transistors. The HEMT stack can include a layer of a wide-band gap semiconductor grown on top of another material with a narrower band gap. A junction of two materials with different band gaps is known as a heterojunction.

As used herein, the heterojunction is the interface that occurs between two layers or regions of dissimilar crystalline semiconductors or other materials. A commonly used material combination is GaAs with AlGaAs with the introduction of modulation doping for two-dimensional electron gas (2DEG) generation. Another used material combination is GaN with AlGaN with the introduction of polarization charge for 2DEG generation. The selection of the combination of the materials may vary in dependence on the application.

To allow conduction, semiconductors are doped with impurities, which donate mobile electrons (or holes). However, those electrons are slowed down by collisions with the impurities (dopants) used to generate the electrons. HEMTs avoid this through the use of high mobility electrons generated using the heterojunction. The heterojunction enables a very thin layer of highly mobile conducting electrons with very high concentration, giving the channel very low resistivity, i.e., high electron mobility.

The HEMTs utilizing gallium nitride (GaN) HEMTs perform well at high-powers. As used herein, GaN materials that are suitable for transistors can include binary, tertiary, or quaternary materials.

FIG. 1 shows an example of a conventional GaN HEMT device, described in U.S. publication 2009/0146185, which could be designed to have a threshold voltage of −3V. Layer 10 is a substrate, such as of SiC, sapphire, Si, or GaN, layer 11 is a GaN buffer, and layer 12 is AlGaN, with 20% Al composition as an example ($Al_{0.2}Ga_{0.8}N$). Layers 11 and 12 are both Ga-face material. A negative gate voltage is required to deplete the 2DEG under the gate and thereby turn off the device.

The GaN HEMT device can include one III-nitride semiconductor body with at least two III-nitride layers formed thereon. The material which forms III-nitride layer 12, e.g., AlGaN, has a larger bandgap than that which forms buffer layer 11, e.g., GaN. The polarization field that results from the different materials in the adjacent III-nitride layers induces a conductive two dimensional electron gas (2DEG) region near the junction 9 of the two layers, specifically in the layer with the narrower band gap. The 2DEG region or channel is shown throughout the figures as a dashed line. One of the layers through which current is conducted is the channel layer. Herein, the narrower band gap layer in which the current carrying channel, or the 2DEG channel is located is referred to as the channel layer. The device also includes a gate electrode 18 and source and drain electrodes 16, 17 on each side of the gate electrode 18. The region between the gate and drain and the gate and source, which allows for current to be conducted through the device, is the access region 7. The region below the gate electrode 18 is the gate region 6.

The improvements in the design of GaN devices are focusing on single gate single channel Ga-polar GaN based HEMTs. However, the conventional Ga-polar HEMT usually requires advanced process techniques such as the gate-recess structure, the F-treatment or capping layers in making enhancement-mode (E-mode) device. Those techniques can deplete the 2DEG underneath the gate region but suffer from either controllability issue or lattice damage problems.

An N-polar GaN HEMT device has a reverse polarization field and can be advantageous over Ga-polar device in making single channel E-mode device with low access resistance, and in particular, for low voltage operation, see e.g., U.S. Pat. No. 7,948,011. However, despite the increased performance of the N-polar devices, the drive current under low voltage bias for N-polar GaN HEMT is smaller than the state-of-the-art Ga-polar GaN HEMT. This limitation of the drive current degrades the RF amplification capability and limits the output power density of the device.

A depletion-mode single gate double channels Ga-polar GaN HEMT, described by Rongming Chu, "AlGaN—GaN Double-Channel HEMTs," IEEE Transactions on Electron Device Letters, Vol. 52, No. 4, Page 438, April 2005, generates channel in each GaN layer but lacks of gate control on both channels and is not suitable for power failure protection application.

Thus, there is a need for improvement in current drivability, output power performance and gate controllability of HEMT devices.

SUMMARY OF THE INVENTION

An objective of present invention is to provide a device, such as a high electron mobility transistor (HEMT) having enhanced current carrying capability. It is a further objective of some embodiments to provide a HEMT device having multiple-channel conduction paths. It is a further objective of some embodiments to provide a HEMT operative at low voltage while preserving current carrying capability. It is a further objective of some embodiments to provide a HEMT with both symmetrical and asymmetrical gate control and with flexible channel conduction path development. It is a further objective of some embodiments to provide a HEMT with either E-mode/D-mode or mixed E-mode and D-mode operation.

Some embodiments of the invention are based on a realization that that different polarity nitride stacks can be used to create a HEMT having multiple channels forming at least part of the conduction path between the source and the drain. Specifically, if the stacks of the HEMT have different polarity, then the interference between the channels is minimized, as contrasted with interference of the channels form by stacks of the same polarity.

In some embodiments, each stack includes a corresponding polar GaN layer and optional barrier layers. The channels can either be formed by heterojunction made of the GaN layer and the barrier layer, or by capacitive relationship between the gate and the GaN layer. The formation of dual channels in each stack will lead to multiple channels development within a device. Furthermore, the channel interference is suppressed due to the quantum confinement of each channel within the device.

It is further recognized that it is advantageous to carefully select the thickness of the gate dielectric material and thickness. This is because that the properties of gate dielectric layer are in relation to the gate voltage on the control of capacitive coupling between gate and GaN layer. For example, in some embodiments, the equivalent oxide thickness of the surface gate dielectric layers is inversely proportional to the metal-insulator-oxide capacitance. A careful selection should ensure that a minimum voltage is sufficient to control the 2DEG channel and to create and control the inversion carrier channel.

Some embodiments take advantage of minimizing the thickness of the layers of the stack till optimum thickness avoiding interference between the dual channels. This can be performed for both double-gate and single-gate multiple channel devices.

It is further recognized that the flexibility of the gate control can develop multiple channels. This is because the channel generation is a function of voltage applied to the gate. In some embodiments of the invention with double gate structure, by applying symmetrical or asymmetrical gate control, a variety number of channels can be induced at different gate biases. In some embodiments of the invention with single gate structure, by applying gate control at different voltages, a variety number of channels can be developed.

Accordingly, one embodiment discloses a device, including a source for transmitting an electronic charge; a drain for receiving the electronic charge; a first stack for providing at least part of a conduction path between the source and the drain, wherein the first stack includes a first set of layers of a first polarity, the first set includes a first gallium nitride (GaN) layer of the first polarity; a second stack for providing at least part of the conduction path between the source and the drain, wherein the second stack includes a second set of layers of a second polarity, the second set includes a second gallium nitride (GaN) layer of the second polarity, and wherein the first polarity is different from the second polarity; and at least one gate operatively connected to at least the first stack for controlling a conduction of the electronic charge, such that, during an operation of the device, the conduction path includes a first two-dimensional electron gas (2DEG) channel formed in the first GaN layer and a second 2DEG channel formed in the second GaN layer.

Another embodiment discloses a high electron mobility transistor (HEMT), including a source for transmitting an electronic charge through a conduction path; a source for transmitting an electronic charge; a drain for receiving the electronic charge; a first stack for providing at least part of a conduction path between the source and the drain, wherein the first stack includes a first set of layers of a first polarity, the first set includes a first gallium nitride (GaN) layer of the first polarity; a second stack for providing at least part of the conduction path between the source and the drain, wherein the second stack includes a second set of layers of a second polarity, the second set includes a second gallium nitride (GaN) layer of the second polarity, and wherein the first polarity is different from the second polarity; a first gate electrically connected to the first stack; a second gate electrically connected to the second stack; and a controller for controlling a first voltage of the first gate and a second voltage of the second gate, wherein the conduction path includes a variable number of channels generated based on the first and the second voltage selected by the controller.

Yet another embodiment discloses a method for controlling an operation of a high electron mobility transistor (HEMT), including determining a number of channels of a conduction path required for transmitting an electronic charge from a source to a drain of the HEMT; determining a control mode to be applied to at least one gate of the HEMT to generate the required number of channels; and generating a command to apply the voltage to the gate. The steps of the method can be performed by a processor.

DETAILED DESCRIPTION OF THE PREFERRED EMBODIMENTS

Figure 1:
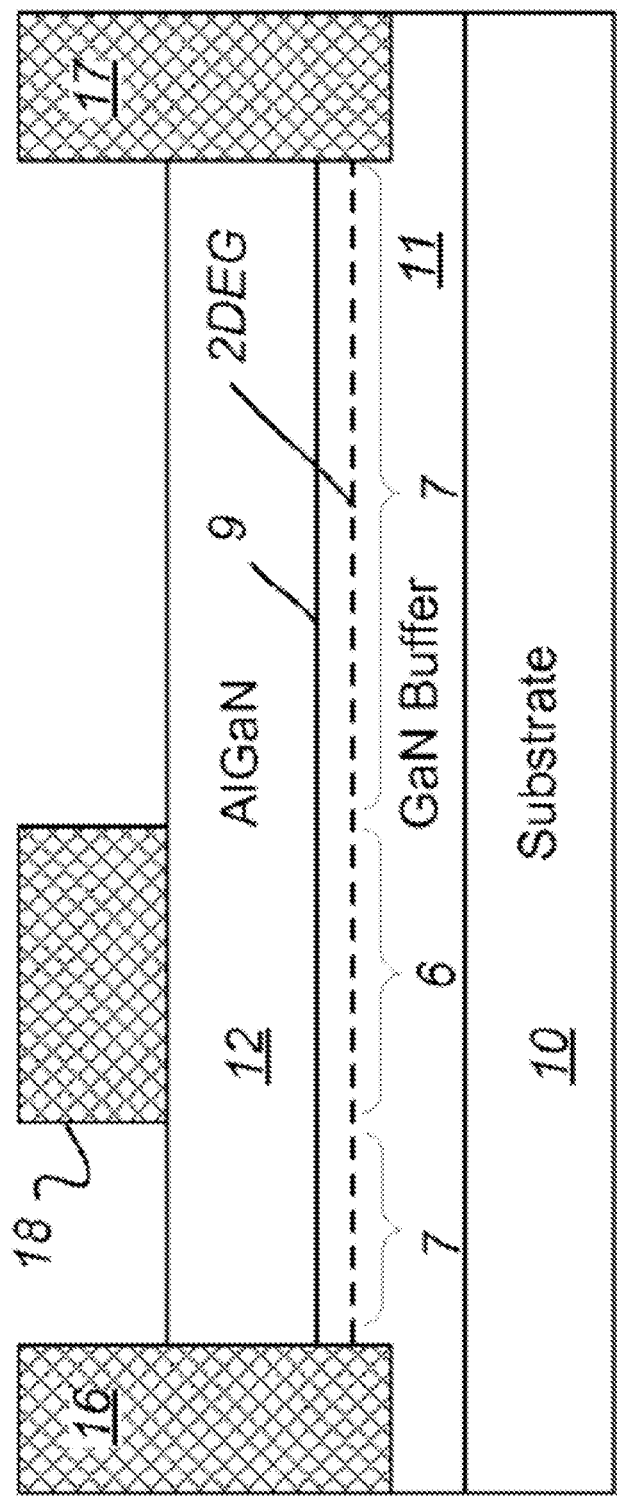
FIG. 1 is a schematic of a conventional high electron mobility transistor (HEMT) with a single channel.
Figure 2A:
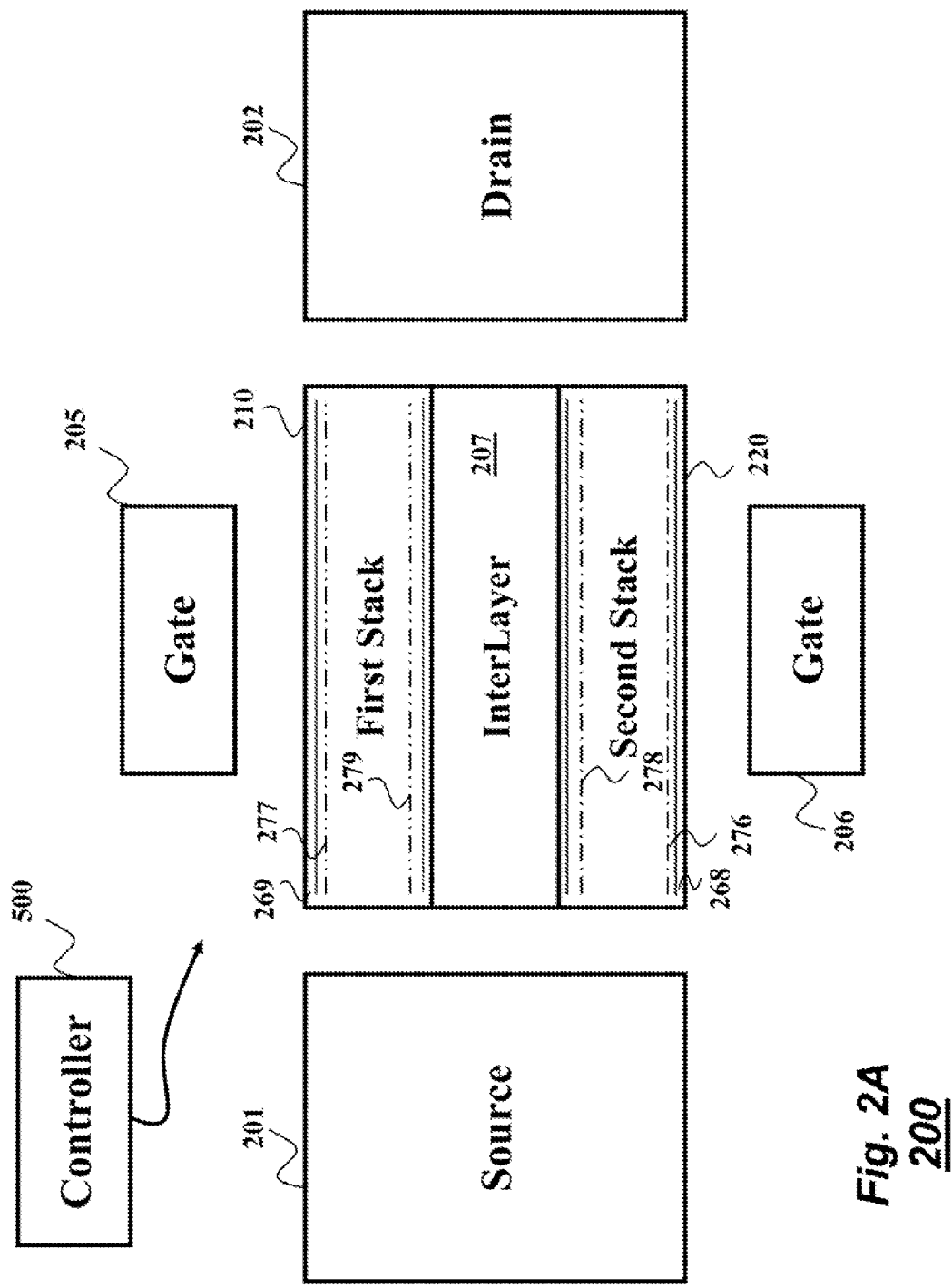
FIG. 2A is a schematic of a device according to an embodiment of the invention.

FIG. 2A shows a schematic of a device 200 designed according to some embodiments of the invention. The device can be a high electron mobility transistor (HEMT) including a source 201 for transmitting electronic carriers, and a drain 202 for receiving electronic carriers. The device also includes two stacks of different polarity for providing at least part of a conduction path between the source and the drain, i.e., a first stack 210 and a second stack 220. The device can also include a interlayer 207 deposited between the first and the second stacks, and at least one gate 205 operatively connected to at least the first stack for controlling a conduction of the electronic charge.

In various embodiments, the first and the second stack are heterostructures including a gallium nitride (GaN) layer for generating two-dimensional electron gas (2DEG) channels due to polarization difference at heterojunction. For example, the gate 205 controls the conduction of the electronic charge, such that, during an operation of the device, the conduction path includes a first two-dimensional electron gas (2DEG) channel 279 formed in the first GaN layer 269 and a second 2DEG channel 278 formed in the second GaN layer 268.

Some embodiments of the invention are based on a realization that that different polarity nitride stacks can be used to create a HEMT having multiple channels forming at least part of the conduction path between the source and the drain.

For example, a device structure with one polarity, e.g., AlGaN/GaN/AlGaN/GaN structure, can be used to generate up to two channels of a conduction path. In addition, the single polarity structure is more challenging to control and can have only one control mode, e.g., D-mode. In contrast, the device with stack of different polarity can increase the number of channels, and improve control capability.

By using various insulator techniques, two stacks of different polarities can be integrated together to create up to four channels. Interference between the channels belonging to the different stacks of different polarity can be reduced as compared to those channels formed by stacks of the same polarity.

Accordingly, in various embodiments of the invention, the first stack 210 includes a first set of layers of a first polarity, i.e., the first set includes the first GaN layer 269 and related polarization layers of the first polarity, and the second stack 220 includes a second set of layers of a second polarity, i.e., the second set includes the second GaN layer 268 and related polarization layers of the second polarity. In accordance with abovementioned realization, the first polarity is different from the second polarity. For example, the first stack can be of Ga-polar polarity, e.g., Wurtzite [0001] Ga-polar, and the second stack can be of N-polar polarity, e.g., [000 $\bar{1}$] N-polar. The polarity of the stacks can be reversed.

In various embodiments, a type of the interlayer 207 is selected based on a design and objective of the device. The insulator separating the nitride stacks, offers two quasi-independent systems for band engineering towards flexible gate control of conduction path development. For example, in one embodiment, the interlayer includes an insulator, such as aluminium nitride/aluminium oxide (AlN/AlOx) insulator. In one embodiment, to achieve the polarity inversion and maintain the independent operation of the two different stacks, the thickness of the interlayer is at least 5 nm.

In alternative embodiment, the polarity inversion is achieved by Magnesium Nitride compound grown by plasma-assisted molecular beam epitaxy method (named as Mg+N treatment). With Mg+N treatment, opposite polarity GaN stacks can be attached together without introduction of the buffer layer for the growth of the top one. This embodiment permits the synchronous single gate control of the channel development in both stacks.

It is further recognized that if the thickness of dielectric material of the gate and/or thickness and structure of the stacks are properly selected, the capacitive relationships between the gate and the layers of the stack can create an additional channel of the conduction path, i.e., an inversion carrier channel. Accordingly, in some embodiments of the invention, during an operation of the device 200 the conduction path can include up to four channels, i.e., up to two 2DEG channels 278 and 279 and up to two inversion carrier channels 276 and 277.

In some embodiments of the invention, the device includes two gates, e.g., a first gate 205 electrically connected to the first stack and a second gate 206 electrically connected to the second stack. These embodiments allow to better control generation of the channels into the corresponding stacks. In addition, these embodiments allow controlling the device both symmetrically and asymmetrically, i.e., to provide a HEMT with both symmetrical and asymmetrical control of the first and the second gates. During the symmetrical control, the voltages supplied to the first and the second gates are identical. During the asymmetrical control, the voltage supplied to the first gate differs from the voltage supplied to the second gate. The symmetrical and asymmetrical control allows creating variable number of channels of the conduction path.

For example, in one embodiment, the device 200 is operatively connected to a controller 500 for controlling a first voltage of the first gate and a second voltage of the second gate. The conduction path includes a variable number of channels generated in accordance with the first and the second voltage selected by the controller. The variable number of channels includes up to four channels selected from a group consisting of a first two-dimensional electron gas (2DEG) channel formed in the first GaN layer, a second 2DEG channel formed in the second GaN layer of the first stack; and a first inversion carrier channel formed in the first GaN layer, and a second inversion carrier channel formed in the second GaN layer of the second stack counting from bottom up.

As described above, the first and the second 2DEG channels are formed in the first and the second GaN layers due to a heterojunction, and the first inversion carrier channel is formed due to capacitive relationship between the first gate and the first GaN layer, and the second inversion carrier channel is formed due to capacitive relationship between the second gate and the second GaN layer. The HEMT having variable number of channels for transmitting electronic carriers through a conduction path is advantageous for some applications.

In some embodiments, the equivalent oxide thickness of the dielectric layers of the gates is inversely proportional to the metal-insulator-oxide capacitance forming the inversion carrier channel. The controller determines a minimum voltage sufficient to create and control the 2DEG channel and the inversion carrier channel. Also, the surface gate dielectric and gate electron material are selected to establish sufficient Schottky barrier height to prevent gate leakage. It is further recognized that it is advantageous to carefully select the thickness of the GaN layer. This is because that the gate electric field penetration is inversely proportional to layer thickness. For example, in various embodiments of single gate multiple channels device, a reduction of the thickness of the GaN layer of the first stack strengthen the gate control of the channel in GaN layer which of the second stack.

Figure 2B:
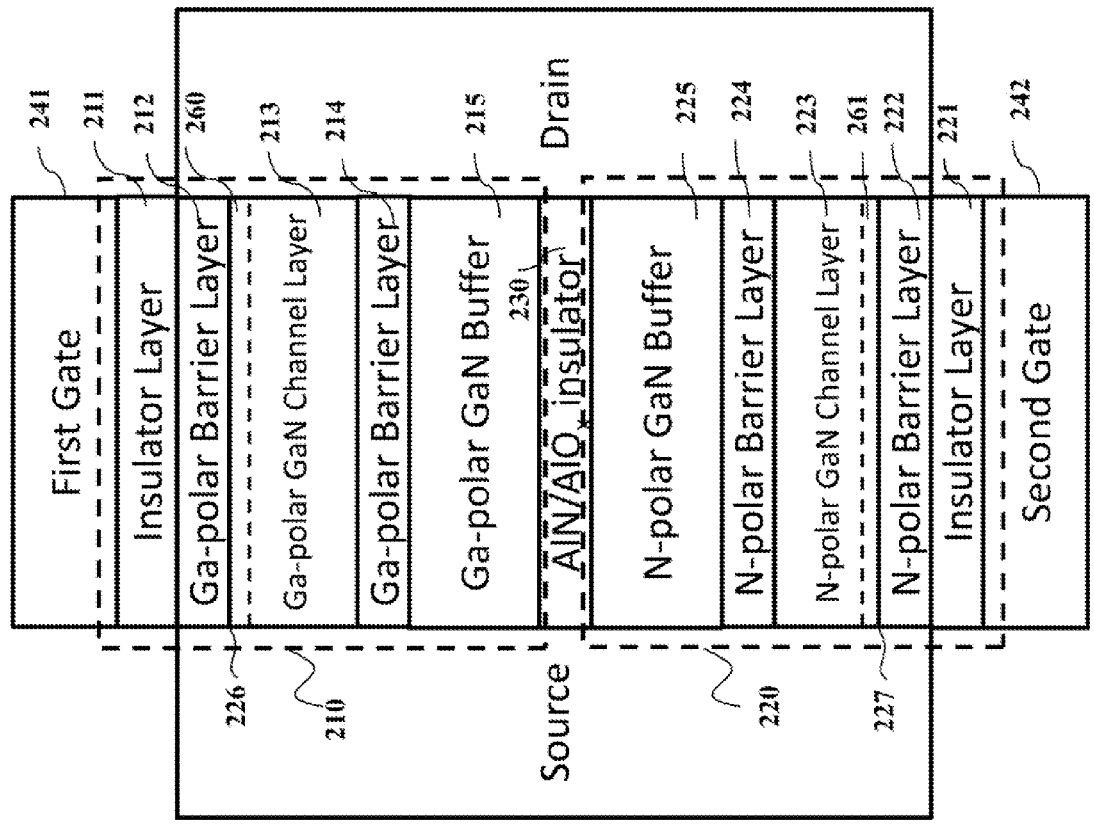
FIG. 2B is a schematic of a high electron mobility transistor with Ga-polar GaN stack on top of N-polar GaN stack according to an embodiment of the invention.

FIG. 2B shows a schematic of the device 200 designed according to one embodiment of the invention. In the device 200 of this embodiment, the first stack 210 includes a Ga-polar GaN stack and the second stack 220 includes an N-polar GaN stack. The first stack 210 includes a Ga-polar buffer layer 215, a first Ga-polar barrier layer 214 deposited on the Ga-polar buffer layer, a Ga-polar GaN layer 213 deposited on the first Ga-polar barrier layer, a second Ga-polar barrier layer 212 deposited on the Ga-polar GaN layer, and a first insulator layer 211 deposited on the second Ga-polar barrier layer. Other variations of the layers are possible.

Similarly, the second stack 220 includes a second insulator layer 221, a first N-polar barrier layer 222 deposited on the second insulator layer, a N-polar GaN layer 223 deposited on the first N-polar barrier layer, the second N-polar barrier layer 224 deposited on the N-polar GaN layer, and a N-polar GaN buffer 225 deposited on the second N-polar barrier layer. The interlayer 230 integrates both N-polar and Ga-polar GaN stacks within one device. Double gates 241 and 242 are applied for channel generation in the GaN channel layer.

The GaN layers 223 and 213 are channel layers. During either symmetrical or asymmetrical operation of the device 200, one two-dimensional electron gas (2DEG) channel 260 is formed in the Ga-polar GaN layer 213; another two-dimensional electron gas (2DEG) channel 261 is formed in the N-polar GaN layer 223. The channels 260, 261 form at least part of the conductive paths between the source and the drain. Accordingly, the device 200 can enhance current carrying capability, because of the dual 2DEG channel conduction paths.

Figure 3A:
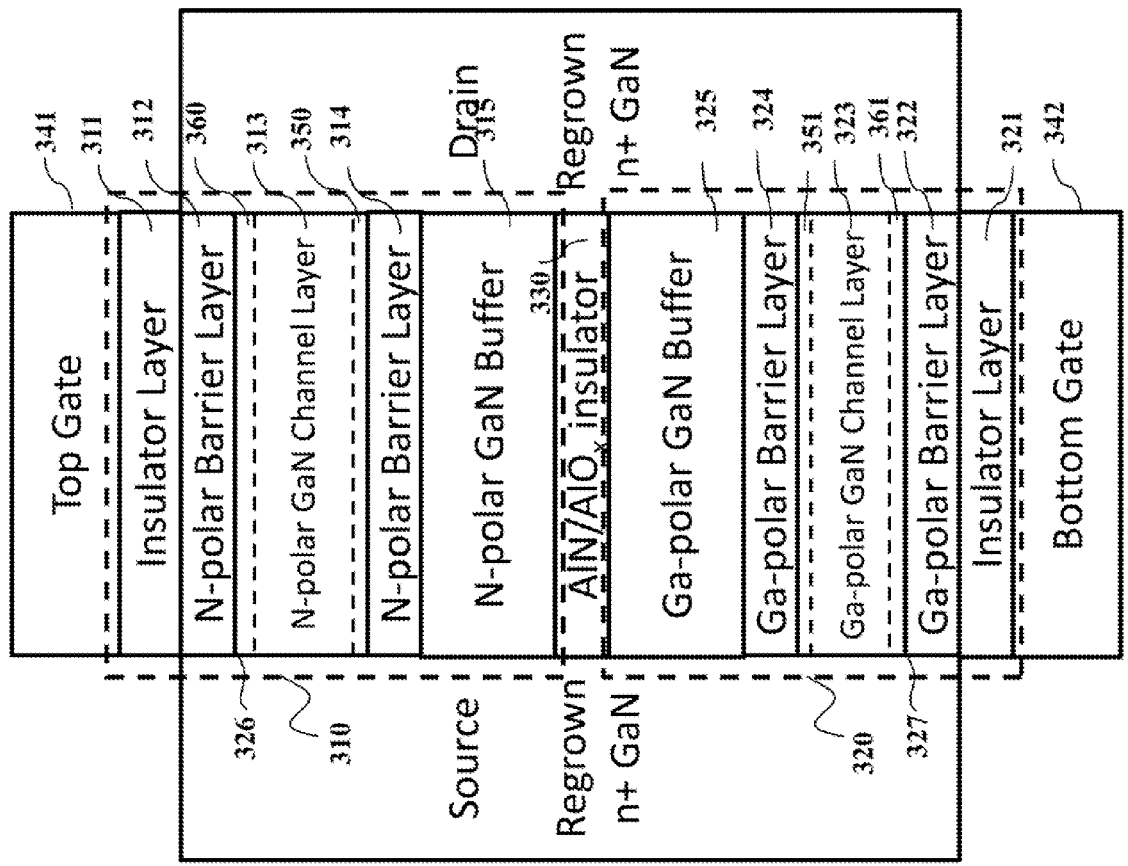
FIG. 3A is a schematic of a double-gate multiple-channel high electron mobility transistor with N-polar GaN stack on top of Ga-polar GaN stack according to an embodiment of the invention.

FIG. 3A shows a schematic of a device 300 designed according to another embodiment of the invention. The device 300 includes an N-polar GaN stack 310 and a Ga-polar GaN stack 320. The stack 310 includes an insulator layer 311, a surface polarization barrier layer 312, a GaN channel layer 313, a back polarization barrier 314 and a buffer layer 315. Similarly, the stack 320 includes an insulator 321, a surface polarization barrier 322, a GaN channel layer 323, a back polarization barrier 324 and a buffer layer 325. The interlayer 330 integrates both Ga-polar and N-polar GaN stacks within one device. Double gate 341 and 342 are applied for channel generation in GaN channel layers. During either symmetrical or asymmetrical operation of the device 300, an inversion carrier channel 360 and a two-dimensional electron gas (2DEG) channel 350 can be formed in the N-polar layer 310. Another inversion carrier channel 361 and two-dimensional electron gas (2DEG) channel 351 can be formed in the Ga-polar layer 320. The channels 350, 351, 360, 361 form at least part of the conductive paths between the source and the drain.

The inversion carrier channels 360, 361 are due to the applied gate voltage at the Metal-Insulator-Semiconductor (MIS) capacitor formed by 341/311/312/313 layers and/or by 342/321/322/323 layers. Accordingly, the device 300 can have greater current carrying capability as well as the specific number of channels dependent on gate control of the development of the four possible channels.

Figure 3B:
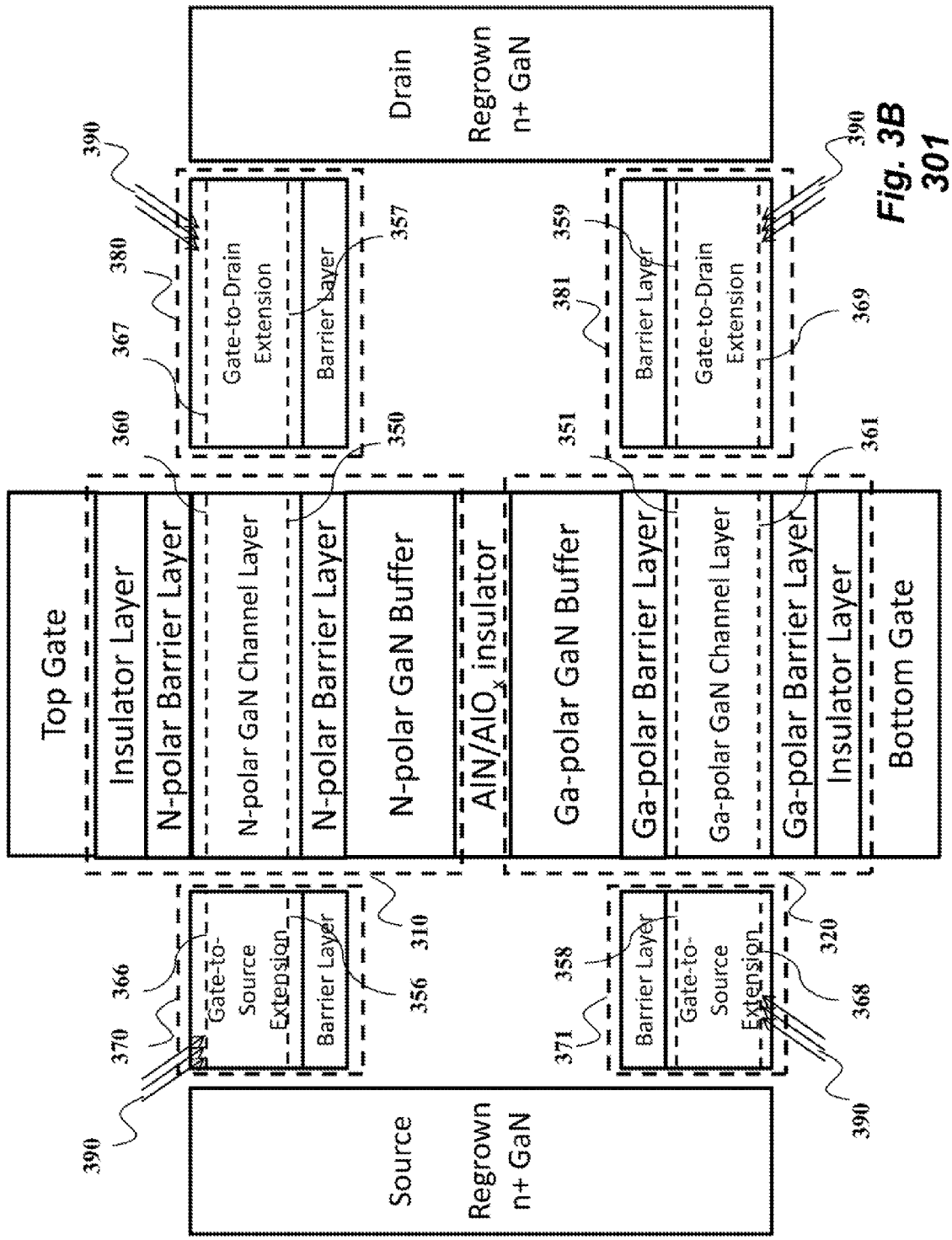
FIG. 3B is a schematic of another double-gate multiple-channel high electron mobility transistor with N-polar GaN stack on top of Ga-polar GaN stack according to an embodiment of the invention.

FIG. 3B shows the double-gate multiple-channel HEMT device 301 according to another embodiments of the invention. In this embodiment, gate-to-source stacks 370, 371 and gate-to-drain stacks 380, 381 are inserted, respectively. Ultra shallow doping 390 is applied to the surface of the regions 370, 371, 380 and 381 to ensure the complete conduction paths (including channel 360, 366 and 367 for N-polar stack, and channel 361, 368 and 369 for Ga-polar stack) connecting source and drain for surface inversion carrier channels.

Similarly, barrier layers are also extended in the extension region to induce 2DEG channels 356, 357, 358 and 359 to form a full conduction path. It should be noted that the diffusion depth of the surface doping can be controlled with a few nanometers to minimize the overlap between the surface inversion carrier channel and the 2DEG channel. The length of the extension regions 370, 371, 380 and 381 can be either symmetrical or asymmetrical. Increase of the length of the gate-to-drain region can reduce the leakage current and alleviate the peak electrical field at the drain side of the gate edge to improve device breakdown performance.

It is further recognized that, for device 200 and 300, by selecting the thickness of the barrier layers, the double gate polarity inversion GaN HEMT is able to provide either E-mode/D-mode or mixed E-mode and D-mode operation. Accordingly, some embodiments of the invention select the thickness of the barrier layers based on the predetermined mode.

Figure 4:
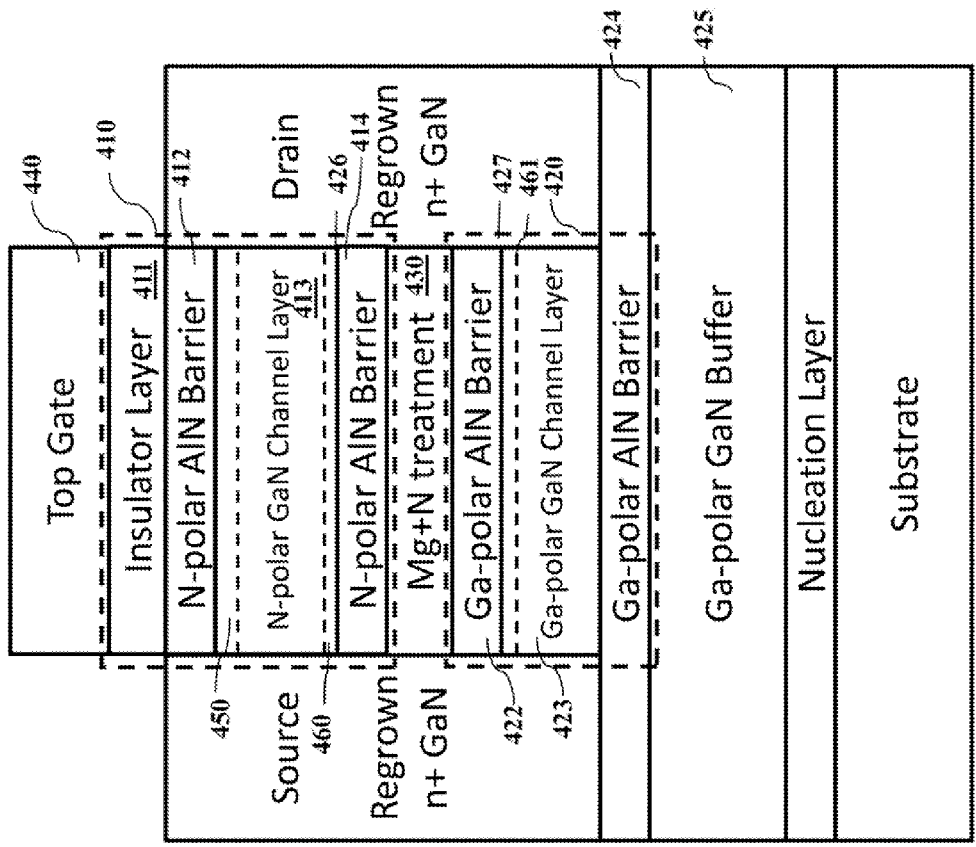
FIG. 4 is a schematic of a single-gate multiple-channel high electron mobility transistor with N-polar stack on top of Ga-polar stack according to an embodiment of the invention.

FIG. 4 shows a schematic of a device 400 designed according to embodiments of the invention. The device 400 includes an N-polar GaN stack 410 and a Ga-polar GaN stack 420. The stack 410 includes a gate insulator 411, a surface polarization barrier 412, a GaN channel layer 413 and a back polarization barrier 414.

Similarly, the stack 420 includes a surface polarization barrier 422, a GaN channel layer 423, a back polarization barrier 424 and a buffer layer 425. The interlayer 430 includes a thin doping layer achieved by a specific treatment. For example, in one embodiment, the doping layer is formed by Mg+N treatment. Other embodiments use different techniques. The doping layer integrates both Ga-polar and N-polar GaN stacks within one device. The gate 440 is applied for channel generation in GaN channel layers. By selection of Mg+N treatment to tune the fixed charge to offset the polarization charges at the polarity inversion interface, multiple channels can be developed within the device. In the N-polar GaN layer, inversion channel 450 and 2DEG channel 460 can be induced while only 2DEG channel 461 can be induced in the Ga-polar GaN layer.

In this embodiment, the 2DEG channels 460 and 461 are confined in the quantum well formed by the corresponding heterojunctions at the interfaces, 426 and 427, respectively. The inversion carrier channel 450 is due to the applied gate voltage at the MIS capacitor formed by 440/411/412/413. Accordingly, the device 400 can enhance current carrying capability, because of the multiple-channeling. It also can develop the specific number of channels dependent on the gate control.

In the device 400, the arrangements of the stacks 410 and 420 can be reversed. However, for single-gate multi-channel device, arranging N-polar stack 410 on top of Ga-polar stack 420 can provide better gate control over the channel comparing to the structure where the Ga-polar stack is arranged on top of the N-polar stack. In the design of the device shown in FIG. 4, the voltage drop between two 2DEG channels 460 and 461 only involves with two thin barrier layers, which provide a more synchronous gate control of the two channels.

The selection of barrier layer alters the channel development. For example, a single-gate multi-channel device with a 2/20/2 nm N-polar stack 410 and a 3/20/3 nm Ga-polar stack 420 can only create an inversion channel in N-polar GaN layer and a 2DEG channel in Ga-polar GaN layer. This is because the stronger polarization of Ga-polar surface barrier layer 422 offsets the N-polar back barrier 414 impact on the 2DEG channel generation in N-polar GaN layer 413.

A reduction of N-polar GaN layer 413 strengthen the gate control over both 2DEG channel in N-polar and Ga-polar GaN layers (413 and 423). For example, a single-gate multi-channel device with a 2/10/2 nm N-polar stack 410 and a 2/20/2 nm Ga-polar stack 420 can develop another inversion channel 450 in N-polar GaN layer in addition to 2DEG channels 460 and 461 in N-polar and Ga-polar GaN layer, respectively. This is because with equal barrier polarization and reduced surface layer thickness, 2DEG development is synchronized and the electric field at the channel locations is strengthened.

Figure 5:
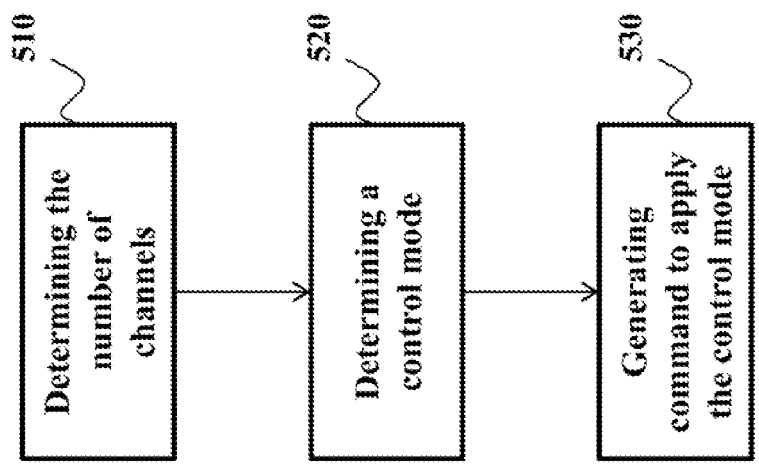
FIG. 5 is a flow chart of a method for controlling an operation of the HEMT designed according to some embodiments of the invention.

FIG. 5 shows a flow chart of a method for controlling an operation of the HEMT designed according to some embodiments of the invention. The method can be implemented by the controller 500 using, e.g., a processor. The controller 500 can be internal module of the HEMT, or can be implemented as a separate device.

The method 500 determines 510 the number of channels required for transmitting an electronic charge from a source to a drain of the HEMT. For example, the number of the channels can be determined based on the targeted current value and semiconductor properties like material, fabrication process, as well as the structure of the device. Next, the method determines 520 a control mode to be applied to at least one gate of the HEMT and the drain terminal to generate the required number of channels. Next, a command to apply the control mode mentioned above is generated 530. The control mode includes the gate bias voltage and drain supply voltage with reference to the source ground terminal. Advantageously, this method allows controlling the gates independently to generate variable number of channels.

The required number of channels varies in dependence of the voltage and includes one or combination of a two-dimensional electron gas (2DEG) channel formed due to heterojunction, and an inversion carrier channel formed due to capacitive relationship between at least one layer of the HEMT and the gate of the HEMT. For example, the introduction of inversion carrier channel increases the number of the channels. To generate the inversion channel, some embodiments increase the gate capacitance by optimizing the MIS structure.

Figure 6A:
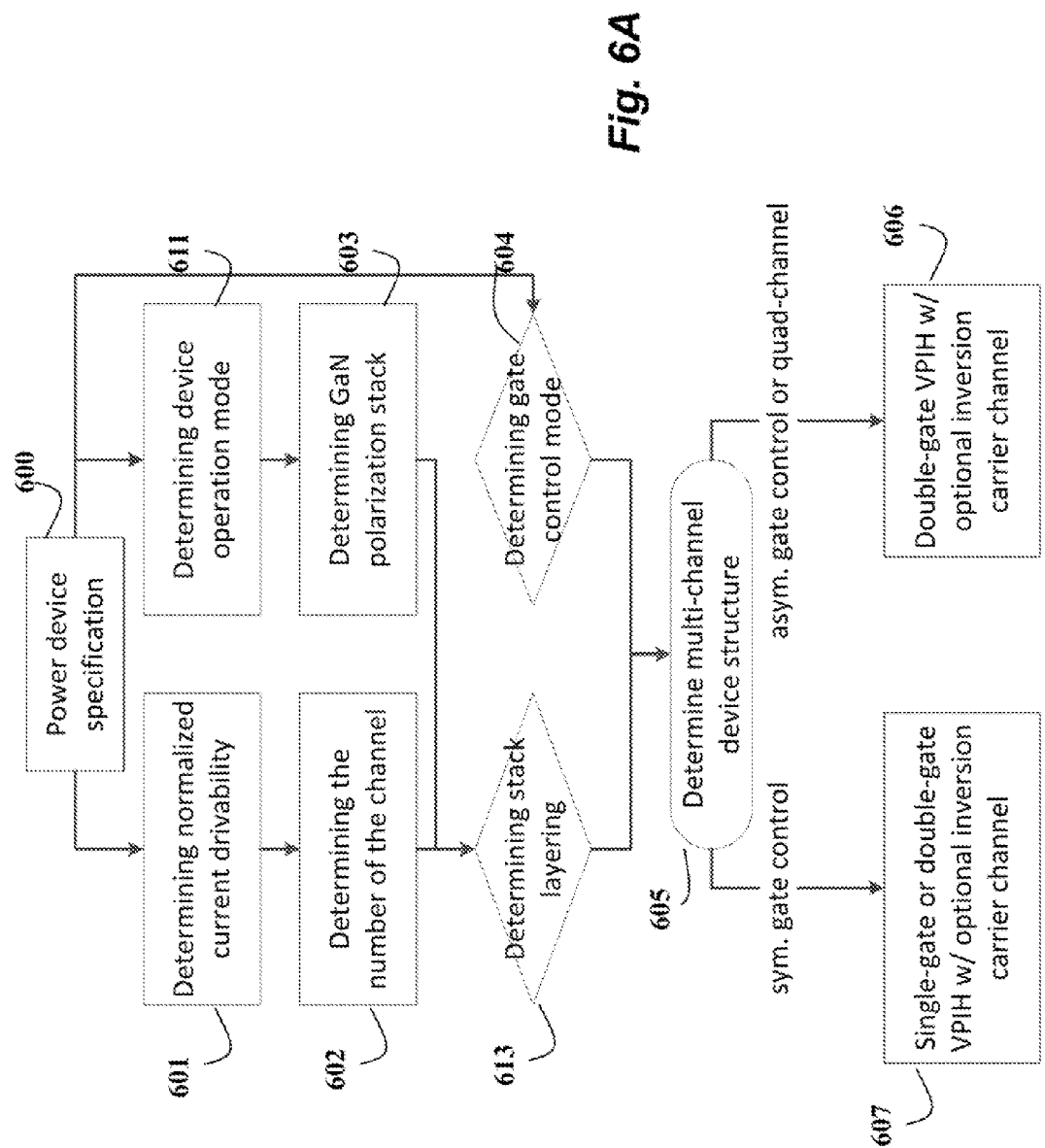
FIGS. 6A and 6B are diagrams of methods for designing the HEMT according to some embodiments of the invention.

FIG. 6A shows a flow chart of a method for determining the device structure of the HEMT designed according to some embodiments of the invention. The method starts from the specification 600 of the power device that can include one or combination of a transistor type, a breakdown voltage, a power carrying capabilities, a power efficiency, etc. Using the specification, the normalized current drivability 601 is determined to specify the required number of channels 602. Also, the device operation mode 611 is determined, e.g., E-mode or D-mode, which in turn can define the GaN polarization stack 603.

According to outcome of the steps 602 and 603, the stack layering 613 and gate control mode 604 is determined. In some embodiments, the structure of the device can be determined according to criteria 605. For example, an asymmetrical gate control or quadruple-channel device require double-gate VPIH (vertical polarity inversion heterostructure) can result in the structure 606. On the other hand, for the symmetrical-gate control, both single-gate and double-gate VPIH 607 can be used. Multi-channel is realized through a combination of 2DEG and inversion channels.

Figure 6B:
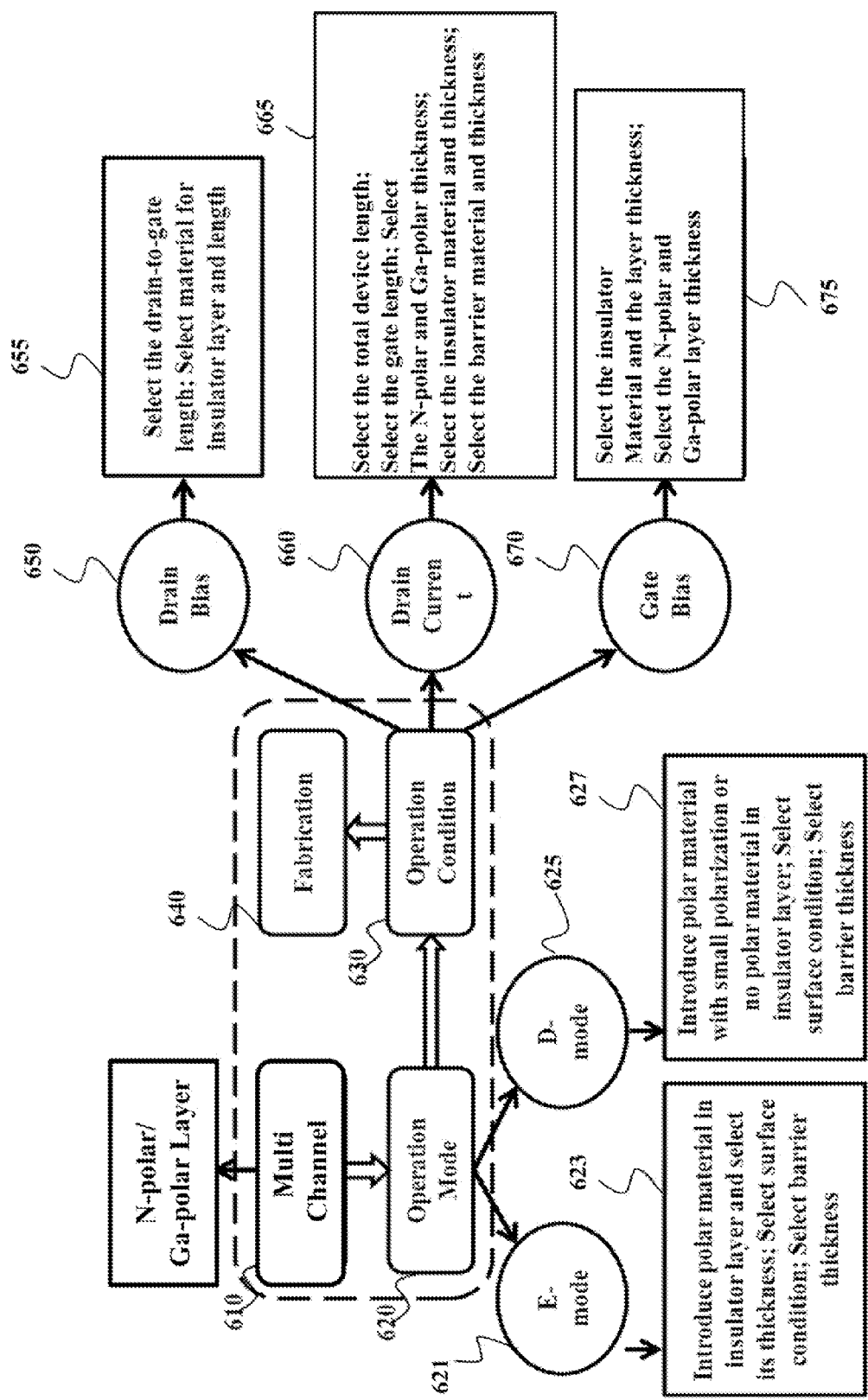

FIG. 6B shows a method 680 for designing the multi-channel HEMT as described above. After the HEMT is designed, the HEMT can be fabricated 640 accordingly. The specification of the N-polar layer and Ga-polar layer mentioned above is selected at step 610. In the device operation mode step 620, polarization material, thickness for both insulator layer and barrier layer are determined 623 and 627 in dependence of the mode 621 or 625 of the device. Some embodiments also determine surface condition of the layers including traps and fixed charges for threshold voltage tuning.

During the operation condition step 630, the drain bias specification 650 is determined 655 including, but not limiting to, the selection of the drain-to-gate length, insulator layer length and insulator material.

To breakdown voltage enhancement, the drain current specification 660 is determined 665 including, but not limiting to, the selection of the total length of the device, the length of the gate, the N-polar and Ga-polar thickness, material and thickness of the insulator and the barrier.

The gate bias speciation 670 is determined 675 including, but not limiting to, the selection of the insulator material and thickness of the insulator thickness, and the N-polar and Ga-polar layer thickness. As discussed above, the trade-off among the device performance specification need to be made when making the selection of the device components. Some steps of the method 600 are determined using a processor.

For example, in one embodiment a thickness of the insulator layer is selected in dependence of a voltage applied to the gate during the operation. In other words, the insulator layer can be related to the threshold voltage, which set the range of the gate voltage for the operation.

The physics for the inversion carrier channel development and bottom 2DEG channel generation are different despite the fact that channels are created in the same layer. The threshold voltage for the 2DEG component can be tuned by the process techniques and experiences only at the state of the art. To induce sufficient inversion carrier, one embodiment induce the gate bias to reach the threshold voltage $V_T$, which is defined as C, C, $$V_T = \phi_{ms} - \frac{Q_f}{C_i} + 2\psi_B + \frac{\sqrt{4\epsilon_s q N_A \psi_B}}{C_i},$$

wherein, $\Phi_{ms}$ is a work-function difference between the gate and the GaN, $Q_f$ is a fixed charge in the insulator layer, $C_i$ is the total capacitance of the insulator dielectrics, $\Psi_B$ is an intrinsic variable determined by the GaN material, $N_A$ is considered to be the value of net polarization charge density at the interface between the GaN layer surface and the dielectric layer. When certain gate dielectrics and gate material are selected, values of $N_A$, $\Psi_B$ and $\Phi_{ms}$ are fixed, and then the tuning task is up to the growth thickness and quality of the gate insulator.

In some embodiments, a thickness of the insulator layer is a proportional function of a dielectric constant of a material of the insulator layer. For example, a small capacitance by a large gate insulator thickness or a low dielectric constant material, or negative interface charge introduced by the process require a large applied gate bias for dual channel formation. On the other hand, an increase in metal-insulator-semiconductor capacitance or an increase in amount of positive charge can lead to the early development of the inversion carrier channel than the 2DEG, which in turn can affect the E-mode operation and cause unwanted leakage consumption.

To further improve the drive current, vertically scaling and optimization of GaN layer thickness are considered by some embodiments. With reduce of the GaN layer thickness, the surface inversion carrier density is not much affected, but the 2DEG density increases due to a stronger electrical field imposed by gate bias due to the reduce distance between the 2DEG and the gate electrode.

Figure 7A:
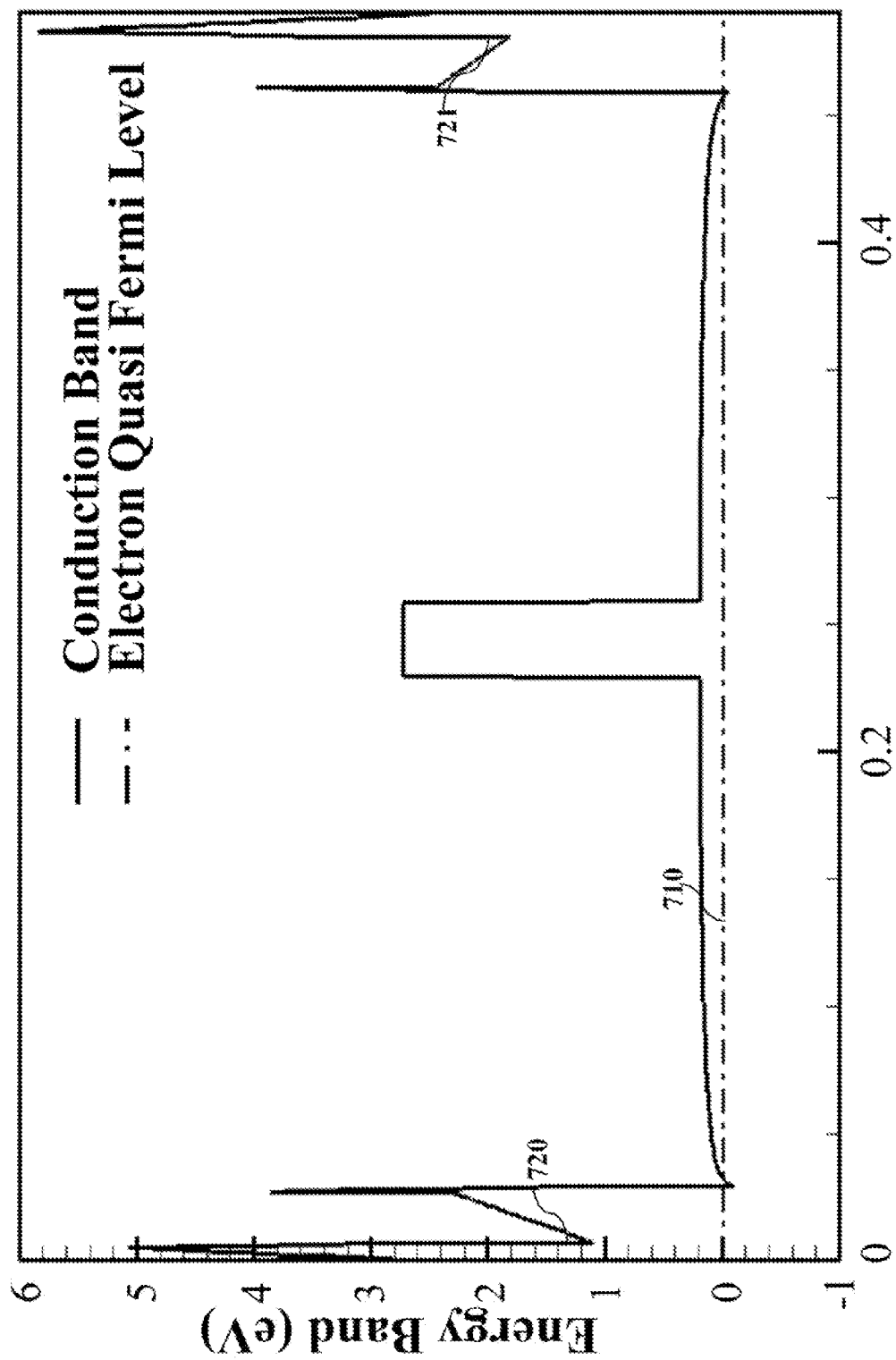
FIG. 7A is a band diagram of an E-mode double gate multiple-channel HEMT device according to some embodiments of the invention under zero bias.

FIG. 7A shows band diagrams of the E-mode double-gate multiple-channel device 200, wherein the 2DEG is depleted beneath the gate layer at zero bias using the sandwich stack 212/213/214 and 222/223/224. The layer 212 and 222 depletes the induced 2DEG 260 and 261 by the other corresponding polarization barrier layer 214 and 224, respectively. In terms of band diagram, these layer 212 and 222 functions to lift the quantum wells 720 and 721 away from the Electron quasi-Fermi level 710 to avoid accumulation of electrons when no gate bias is applied.

Figure 7B:
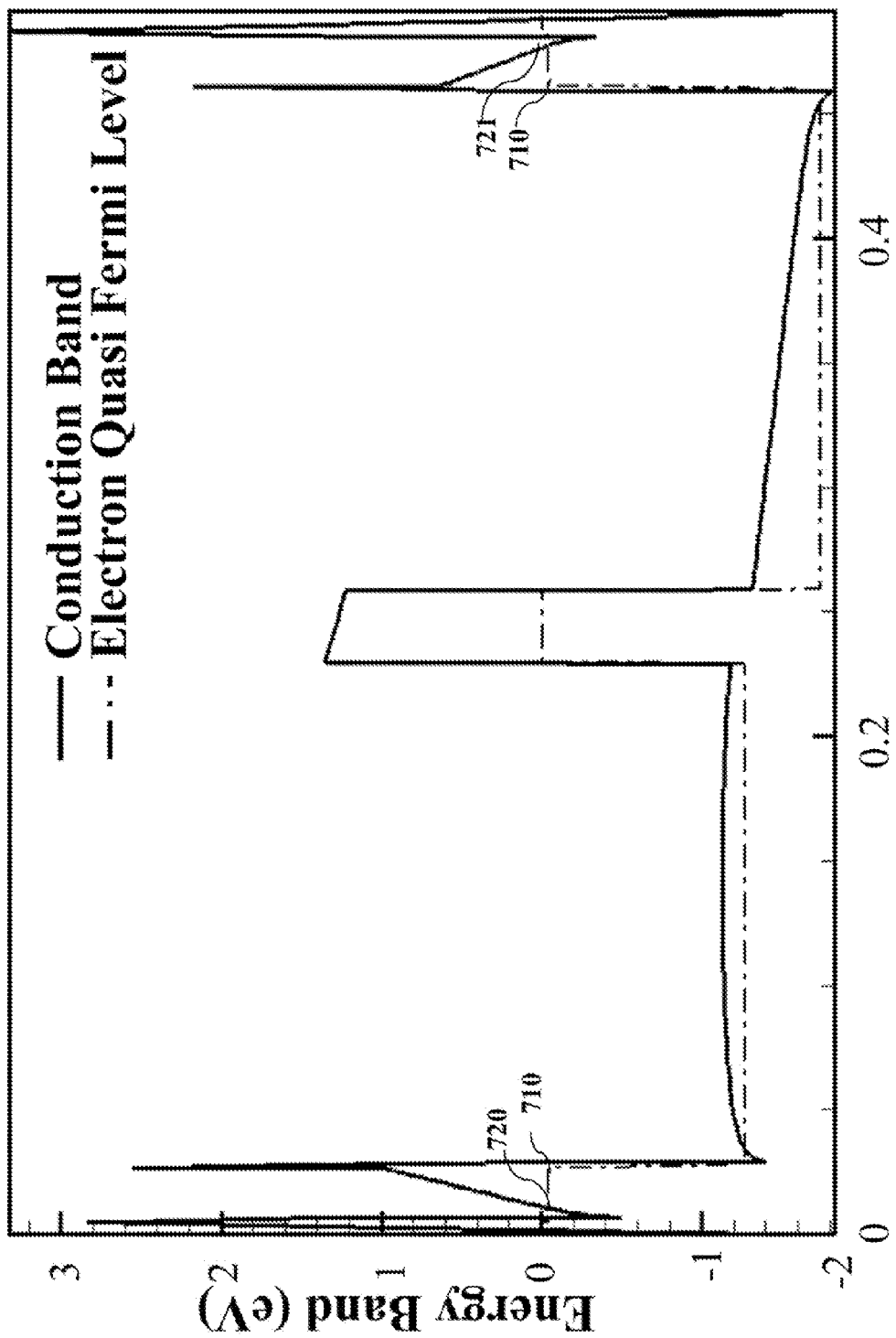
FIG. 7B is a band diagram of the conductive band of a device according to some embodiments of the invention at 4V gate bias.

As the applied gate bias further increases to a positive enough value, the quantum wells 720 and 721 (shown in FIG. 7B) within N-polar and Ga-polar stacks finally dips into the electron quasi-Fermi level 710. FIG. 7B shows the conduction band diagram of the device at 4 V gate bias. The quantum wells below the quasi-Fermi level indicate 2DEG channels 260 and 261.

Figure 7C:
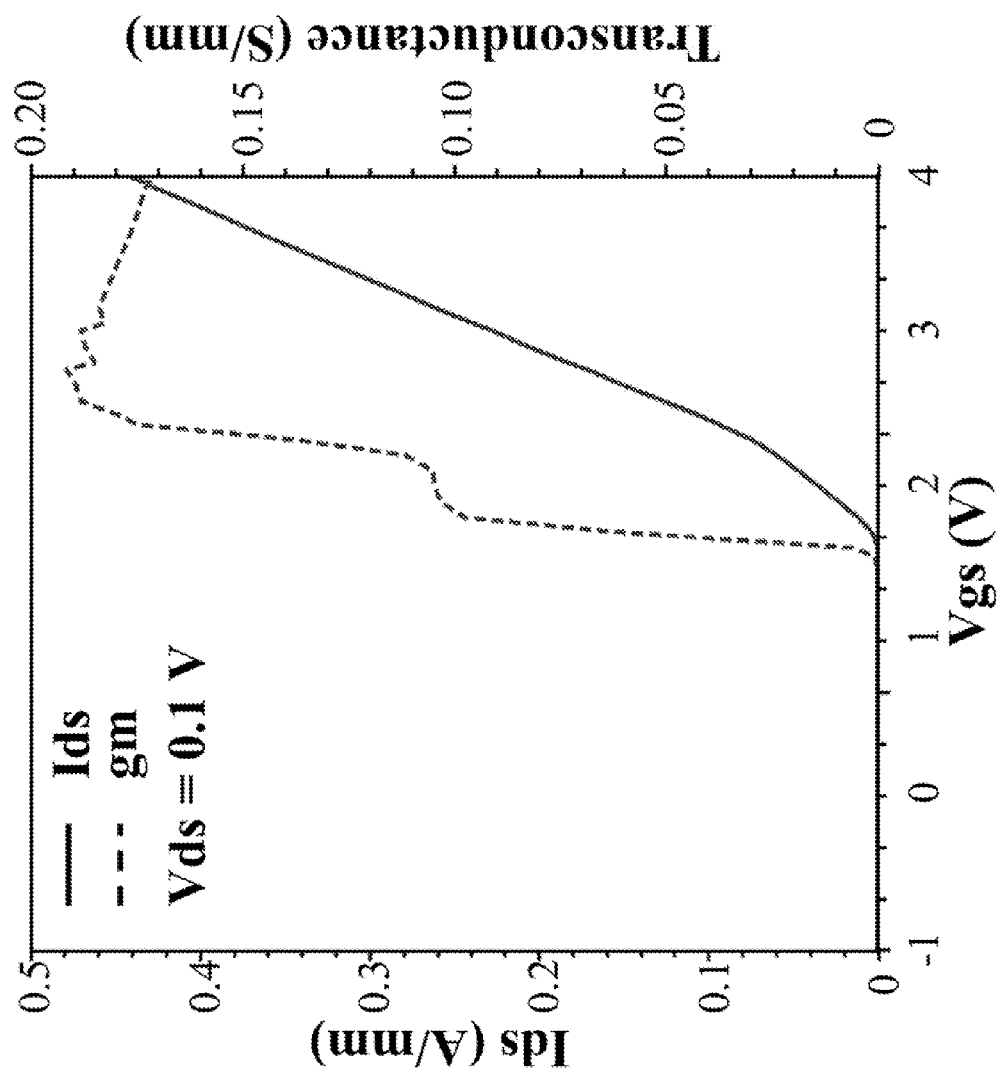
FIG. 7C is a graph of input characteristic of a double-gate double-channel HEMT device according to some embodiments of the invention.
Figure 7D:
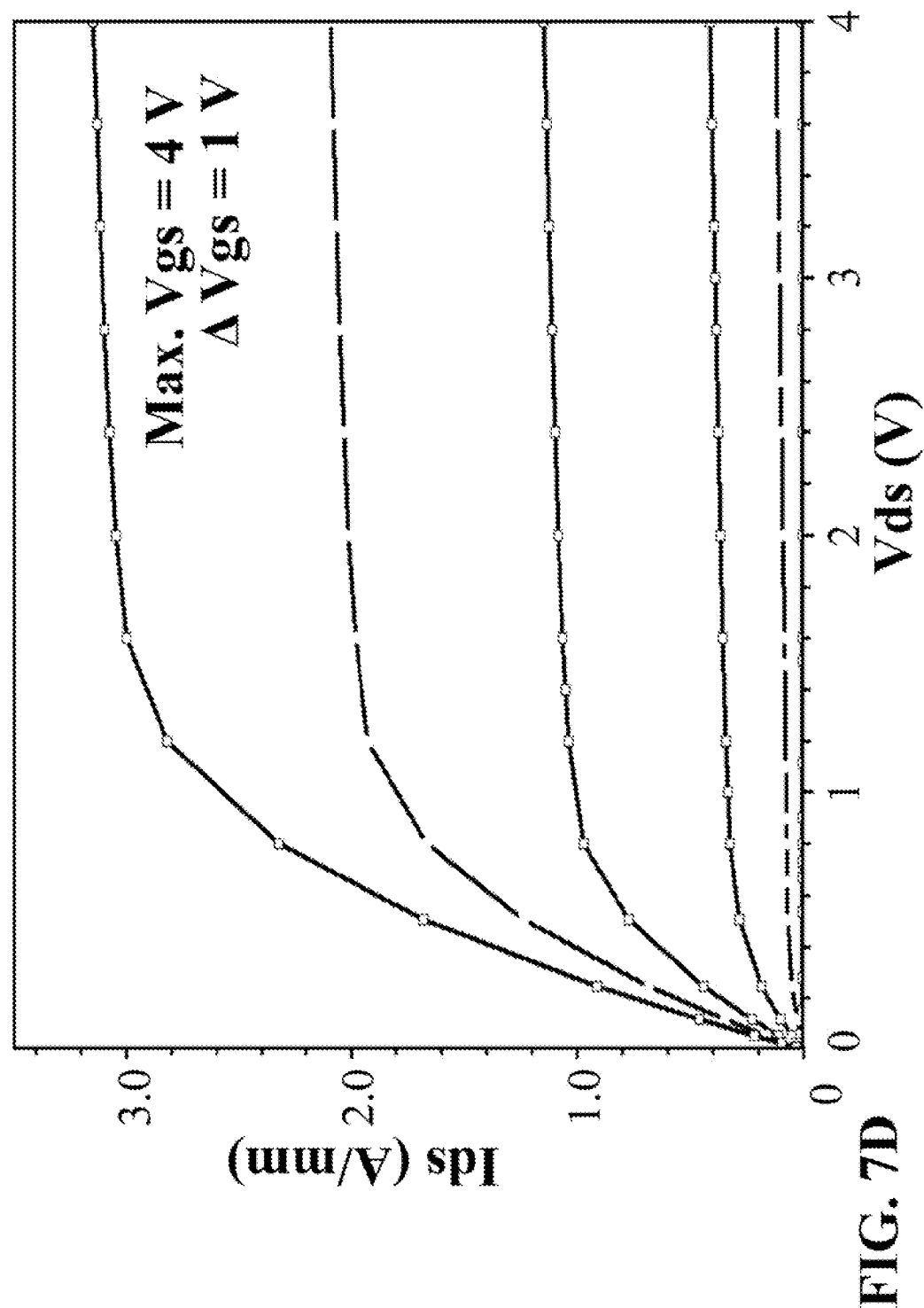
FIG. 7D is a graph of output characteristic of a double-gate double-channel HEMT device according to some embodiments of the invention.

FIGS. 7C and 7D are graphs further illustrating the advantages of the double-gate double-channel HEMT. For example, one advantage lies in the small threshold voltage. As shown in FIG. 7C, the input characteristics demonstrate that the double-gate double-channel device has a threshold voltage of 1.6 V which is suitable for low voltage E-mode operation. Another advantage lies in the boost of the drain current. As shown in FIG. 7D, at low voltage bias (Vgs=4 V and Vds=4 V), the maximum normalized drain current of dual channel reaches about 3.0 A/1 mm, which is almost four times of the conventional single channel device maximum current carrying capability under the same bias condition. The increase of the drive current is contributed by the stronger polarization due to the barrier layers and the multiple 2DEG channels.

This further increase of the drain current can also be achieved by the interface condition improvement which can reduce defects and therefore reduce scattering. The interface condition can be improved by molecular beam epitaxy growth of the epi-layers to minimize the defects during the fabrication.

Figure 8A:
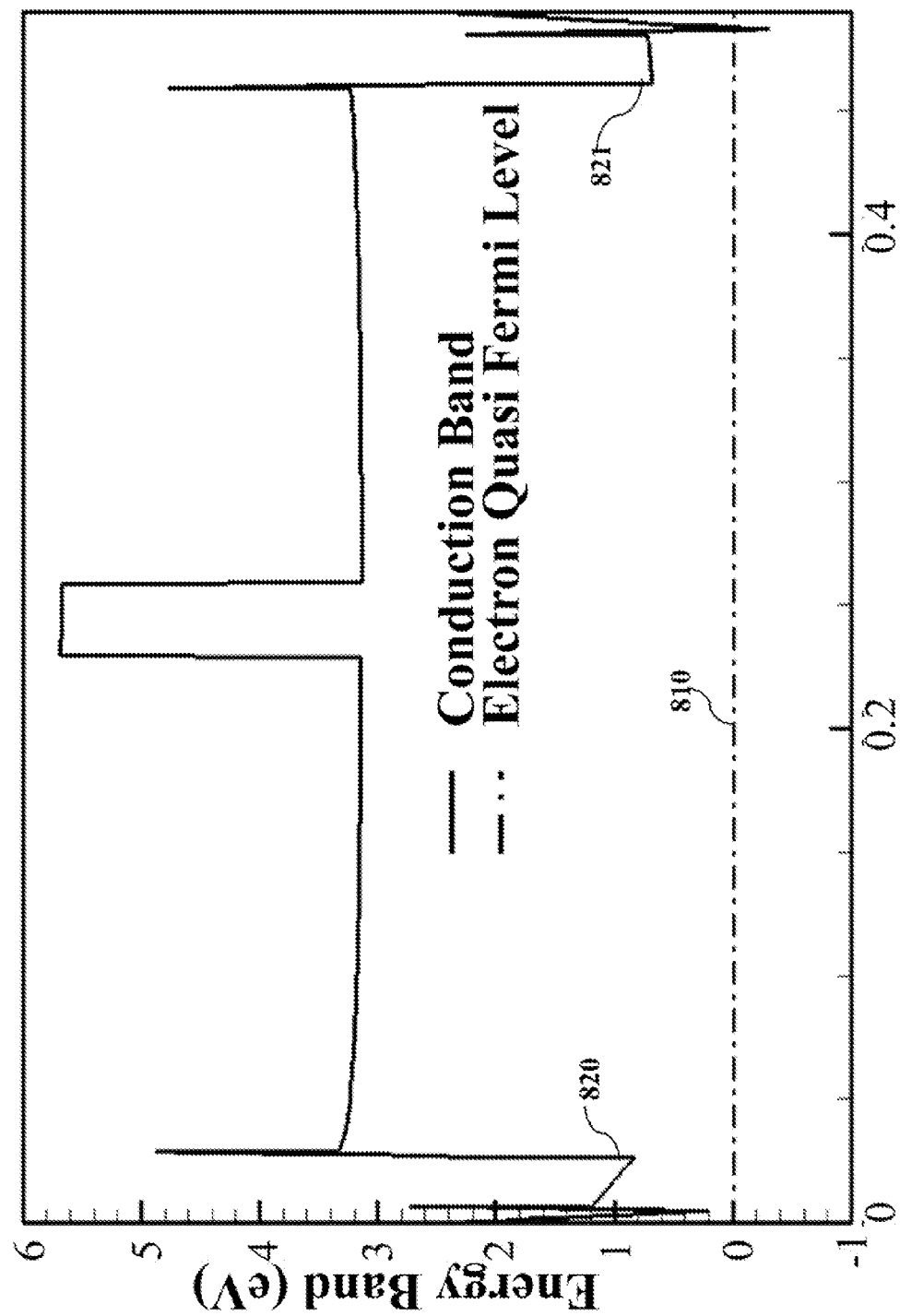
FIG. 8A is a band diagram of a multiple-channel HEMT according to some embodiments of the invention under zero bias.
Figure 8B:
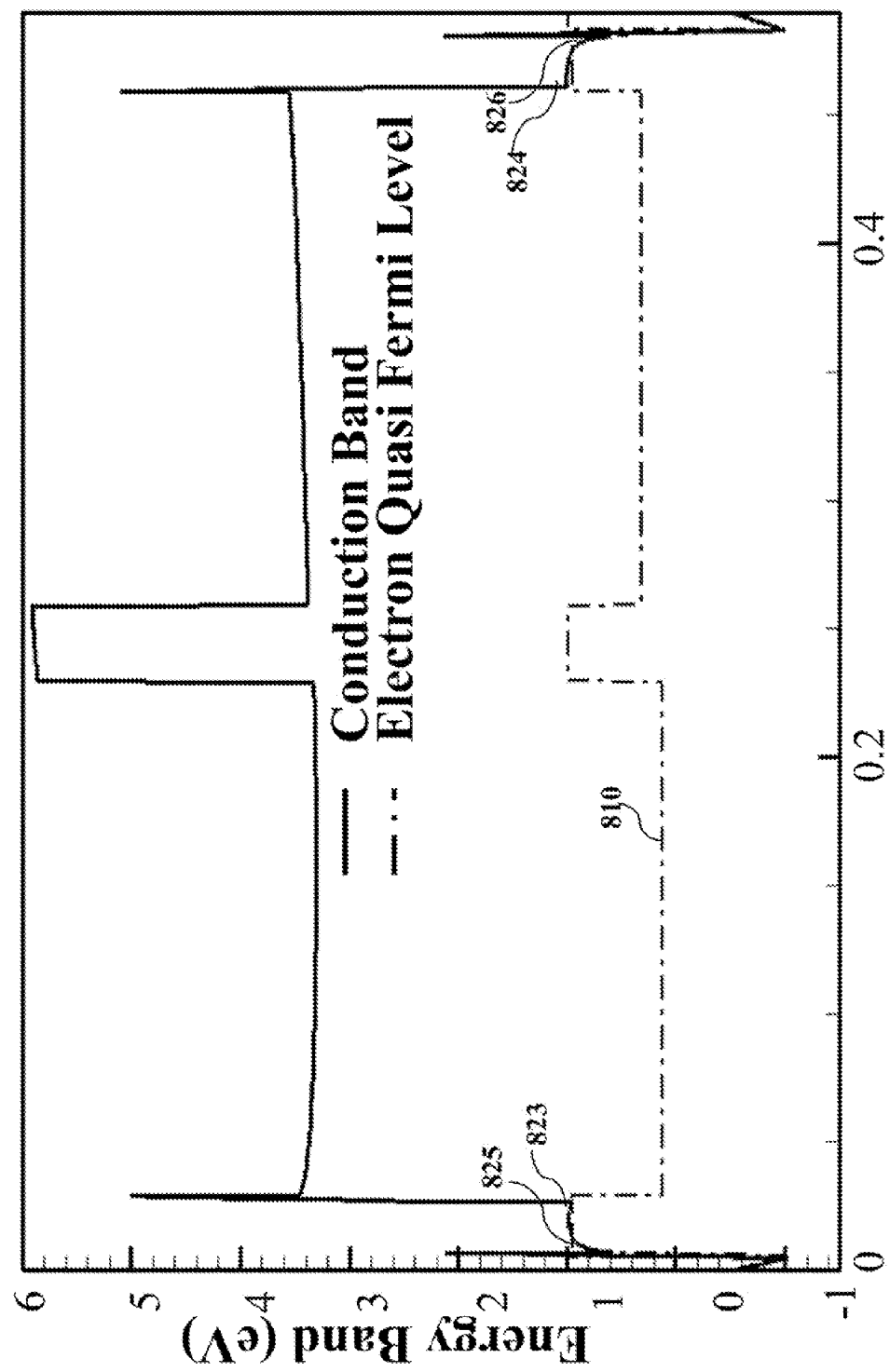
FIG. 8B is a band diagram of a multiple-channel HEMT according to some embodiments of the invention at 4V gate bias.

FIGS. 8A and 8B shows that for multiple 2DEG channels 350, 351 and other possible inversion channels 360 and 361, as the applied gate bias further increases, the quantum well in N-polar and Ga-polar stack gradually approaches the electron quasi-Fermi level and finally dips into it as the gate voltage reaches a certain value. With optimized gate dielectric layers including 311 and 312, the GaN surface conduction band can also bend downwards when the equivalent oxide thickness of the gate dielectric layers is minimized. The quantum wells 823 and 824 below the quasi-Fermi level indicate 2DEG channels 350 and 351. The quantum wells 825 and 826 at the gate insulator stack interface indicate inversion channels 360 and 361. The Fermi level 810 and band profiles 820 and 821 illustrates how the energy band profiles were altered with applied biasing.

Figure 8C:
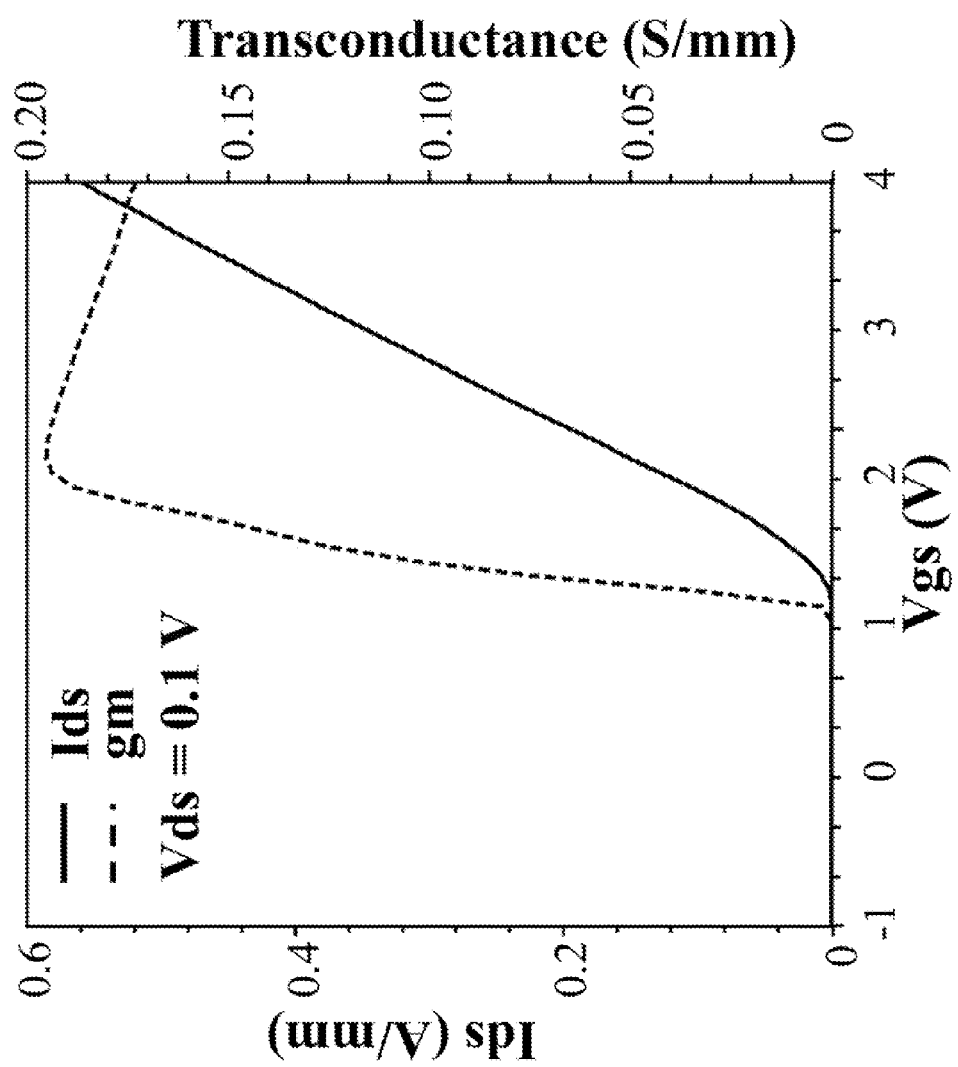
FIG. 8C is a graph of input characteristic of a double-gate multiple-channel HEMT device according to some embodiments of the invention.
Figure 8D:
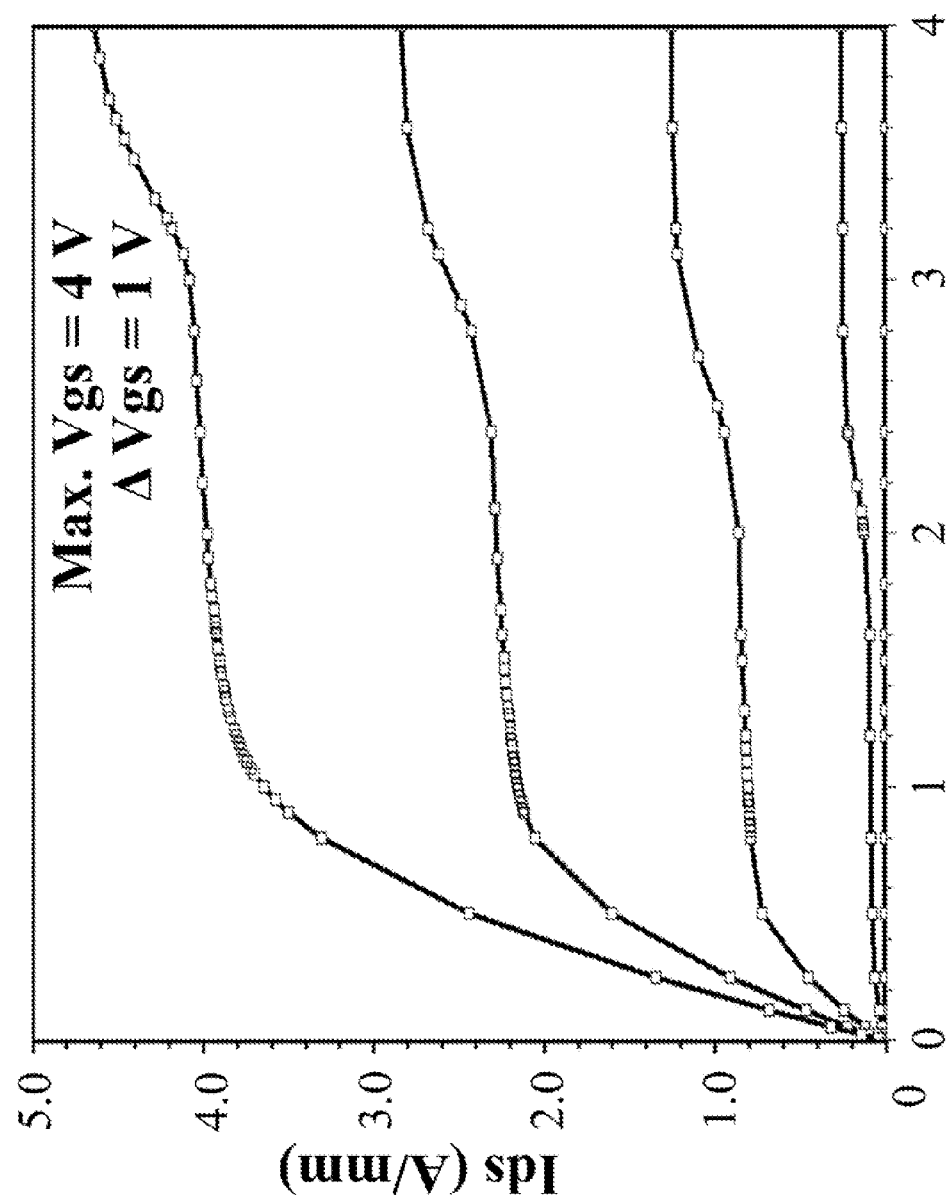
FIG. 8D is a graph of output characteristic of a double-gate dual-channel HEMT device according to some embodiments of the invention.

FIGS. 8C and 8D are graphs further illustrating the advantages of the double-gate multiple-channel HEMT 301 over a single channel HEMT device. For example, one advantage lies in the small threshold voltage. As shown in FIG. 8C, the input characteristics demonstrate that the double-gate multiple-channel device has a threshold voltage of 1.0 V which is suitable for low voltage E-mode operation. Another advantage lies in the boost of the drain current. As shown in FIG. 8D, under low voltage bias (Vgs=4 V and Vds=4 V), the maximum normalized drain current of dual channels reaches about 4.6 A/mm, which is almost six times of the single channel device maximum current carrying capability under the same bias condition. The increase of the drive current is contributed by the stronger polarization due to the barrier layer, the introduction of inversion channel and the additional pair of 2DEG and inversion conduction paths. In addition, for device 301, because the inversion carrier channel 360 and 361 are separated from the 2DEG channel 350 and 351, the confinement of each channel minimizes the reduction in electronic carrier mobility. It also should be noted that within both Ga-polar and N-polar GaN layers, the thickness of each layer can be optimized to achieve good confinement of channels to minimize the carrier mobility degradation.

The current carrying capability can be further improved by the engineering of either the surface inversion carrier channel component or the bottom 2DEG sheet channel component, or both of them. For example, the current drivability of the surface inversion carrier channel is related to the condition of the interface, the electron density and the carrier confinement. The interface condition can be improved with abovementioned methods. The electron density can be increased either by strengthening the electric field through thinning the layer thickness or increasing the polarization difference at the heterojunction.

The 2DEG current conductivity can also be increased by using wide bandgap polarized material with heavy doping for the barrier layer. The wide bandgap polarized material is expected to generate larger net polarization difference that induces more 2DEG close to the interface 326 and 327. The 2DEG channel current component enhancement can also be done by vertically scaling the GaN layer. The latter method employs a vertically scaled GaN layer which has a smaller resistance in the vertical direction. This scaling strengthens electric field modulation at the bottom interface 326 and 327 and therefore leads to a higher density of inversion of the 2DEG sheet.

Figure 9A:
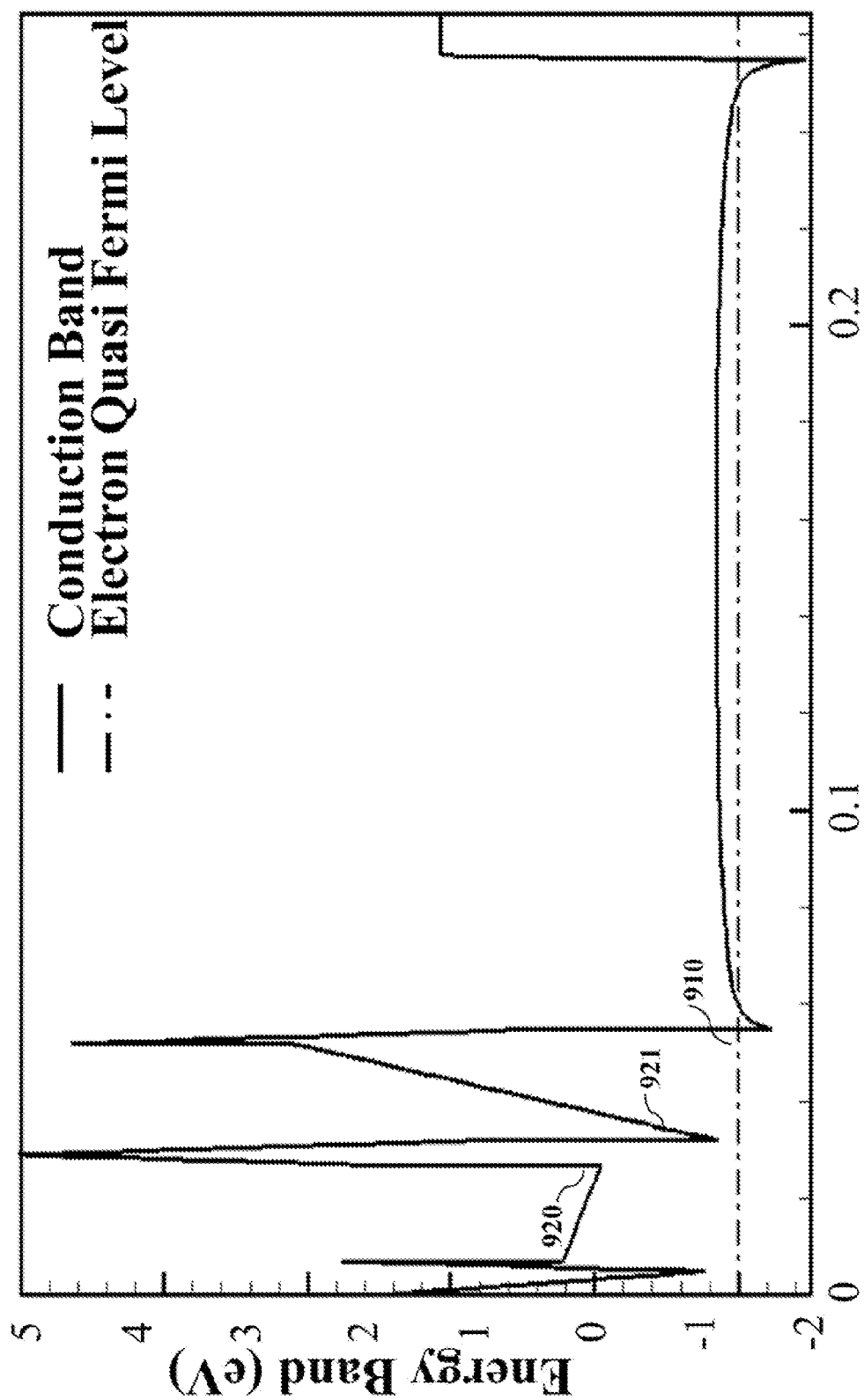
FIG. 9A is a band diagram of an E-mode single-gate double-channel HEMT device according to some embodiments of the invention.

FIG. 9A shows band diagrams of the E-mode single-gate multiple-channel device 400, wherein the 2DEG is depleted beneath the gate layer at zero bias using the sandwich stack 411/412/413 and 422/423/424. The layers 412 and 422 deplete the induced 2DEG 460 and 461 by the other corresponding polarization barrier layer 414 and 424, respectively. In terms of band diagram, these layer 412 and 422 function to lift the quantum wells 920 and 921 away from the Fermi level 910 to avoid accumulation of electrons at zero bias.

Figure 9B:
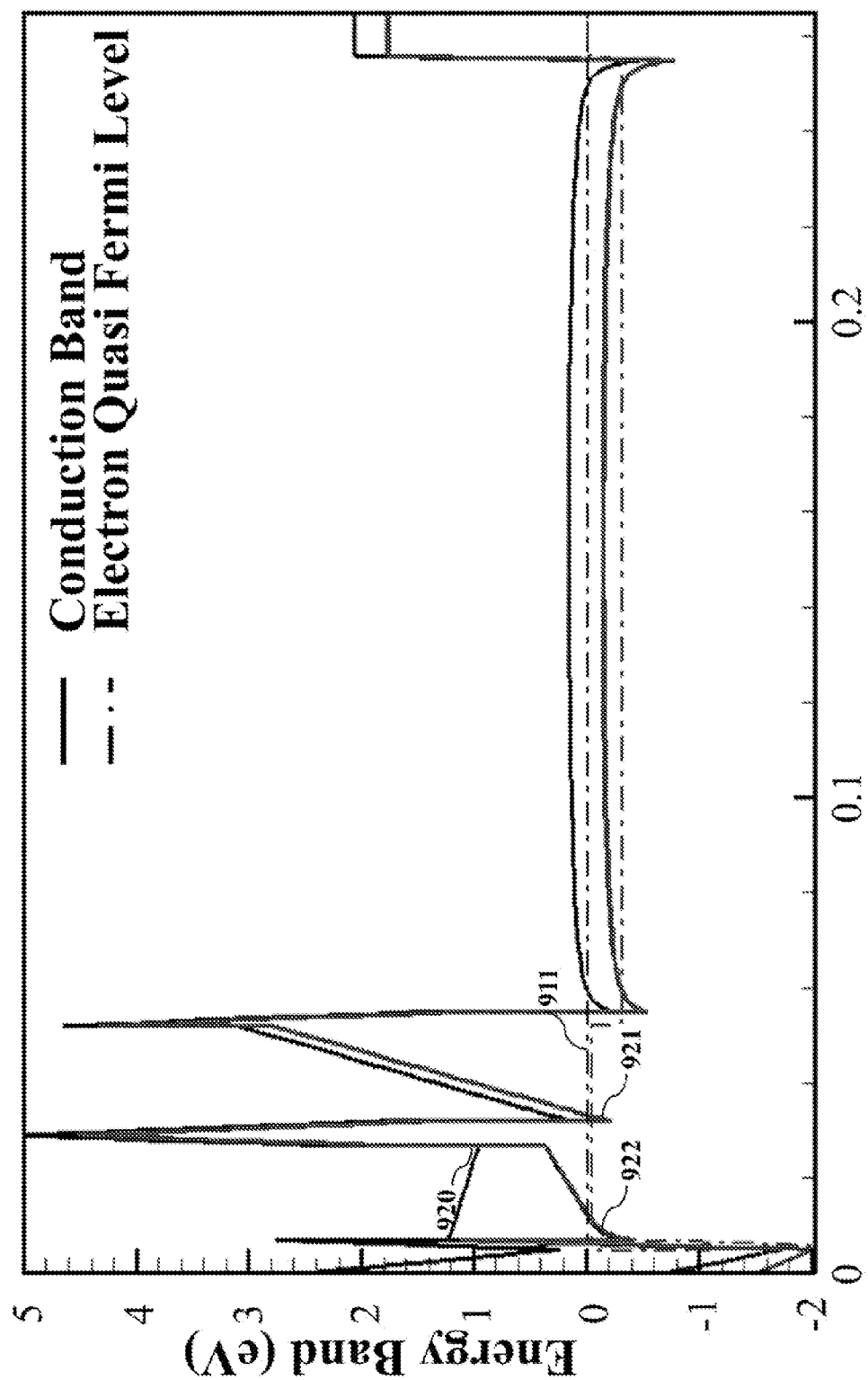
FIG. 9B is a band diagram of a E-mode single-gate double-channel HEMT device according to some embodiments of the invention with a positive enough gate bias voltage.

For multiple-channel including inversion channel 450 and 2DEG channel 461, as the applied gate bias further increases to a positive enough value, the quantum well 921 (shown in FIG. 9B) in Ga-polar stack finally dips into the electron quasi-Fermi level 911. However, the stronger polarization of Ga-polar barrier layer 422 prevents the quantum well 920 reaching the quasi-Fermi level. In this case, the 2DEG channel 460 is not able to be developed in the N-polar GaN stack. But, the GaN surface conduction band 922 bends downwards due to the strong applied gate bias. This bending process is similar to the metal-oxide-semiconductor field effect transistor (MOSFET) surface inversion layer formation. As a positive enough voltage is applied, negative charge is built up in the GaN layer close to the surface interface. Initially this charge is due to the depletion of the semiconductor starting from the insulator-semiconductor interface. The depletion layer width further increases with increasing gate voltage, but it is limited by the thickness of GaN layer. With further increase of the gate voltage, the surface conduction band 922 is bending towards the Fermi level at the interface.

Figure 9C:
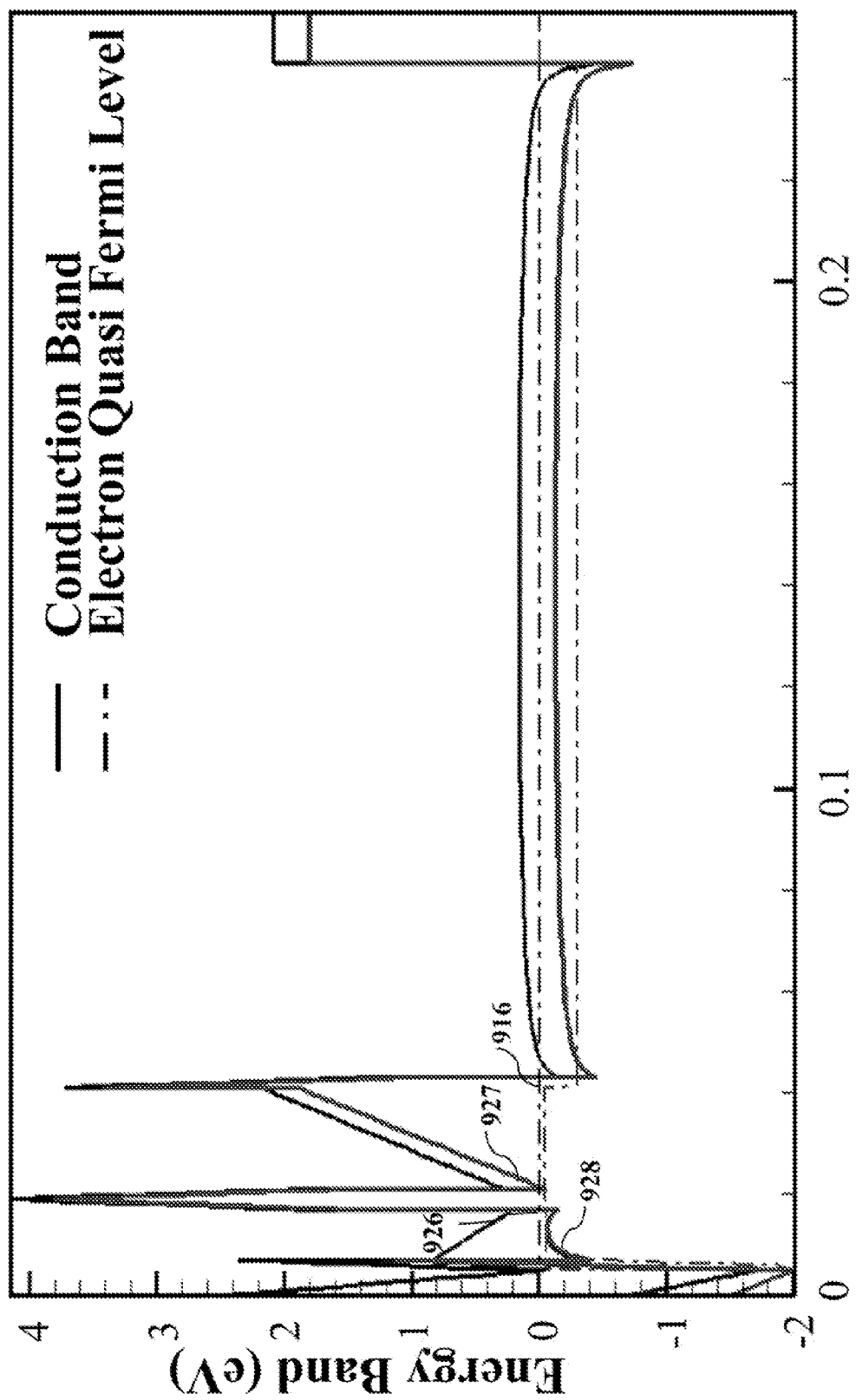
FIG. 9C is the band diagram of a single-gate multiple-channel HEMT device according to some embodiments of the invention with a positive enough gate bias voltage.

For multiple-channel including 2DEG channel 460, 461 and another possible inversion channel 450, as the applied gate bias further increases, the quantum wells 926 and 927 (shown in FIG. 9C) in N-polar and Ga-polar stack gradually approach the electron quasi-Fermi level 716 and finally dip into it as the gate voltage reaches a certain value. With optimized gate dielectric layers including 411 and 412, the GaN surface conduction band 928 can also bend downwards when the equivalent oxide thickness of the gate dielectric layers is minimized. In this scenario, for N-polar GaN HEMT, this surface inversion carrier channel 450 is separated from the 2DEG channel 460 that is close to the bottom interface.

Figure 9D:
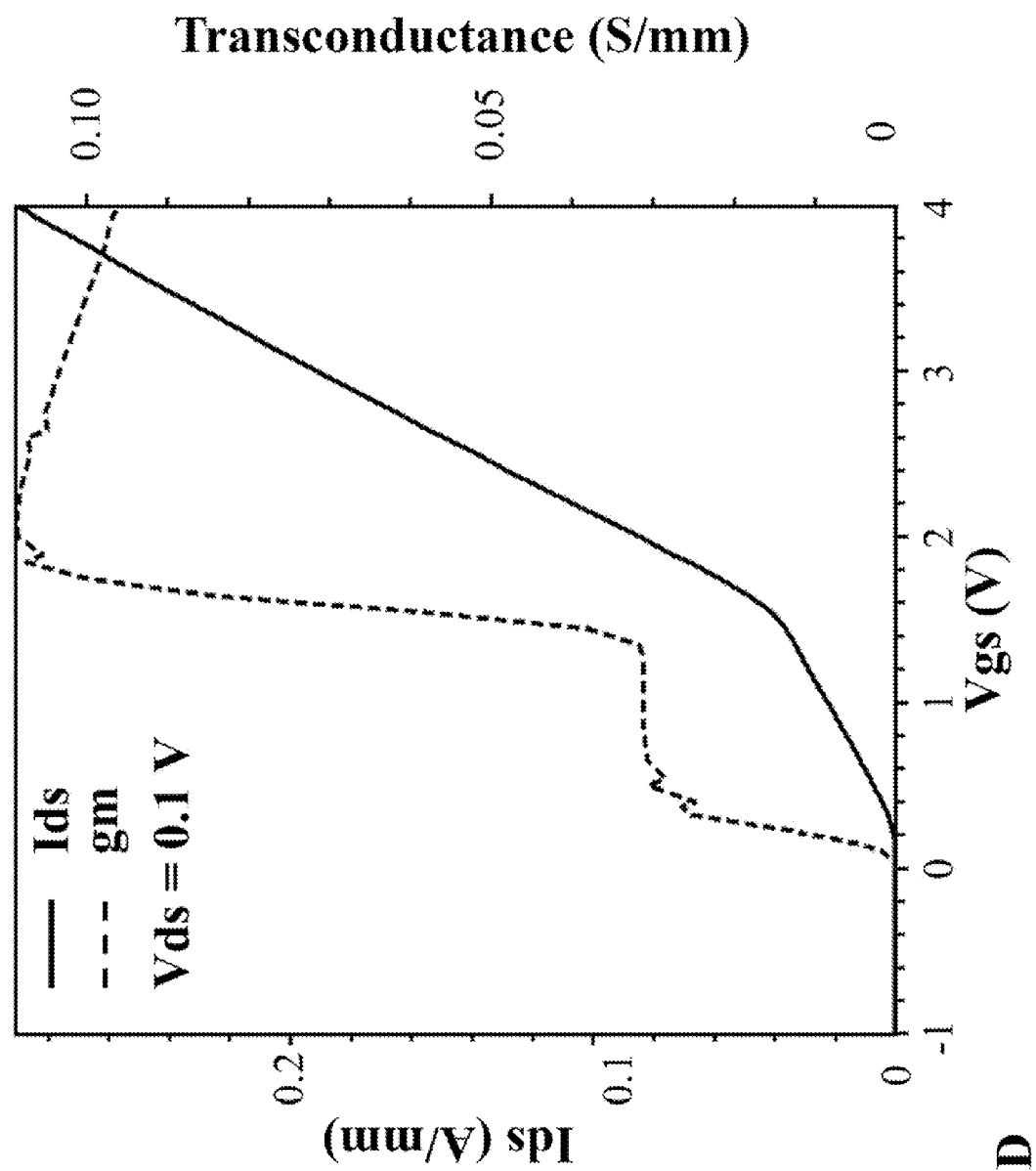
FIG. 9D is an input characteristic of a single-gate double-channel HEMT device according to some embodiments of the invention.
Figure 9E:
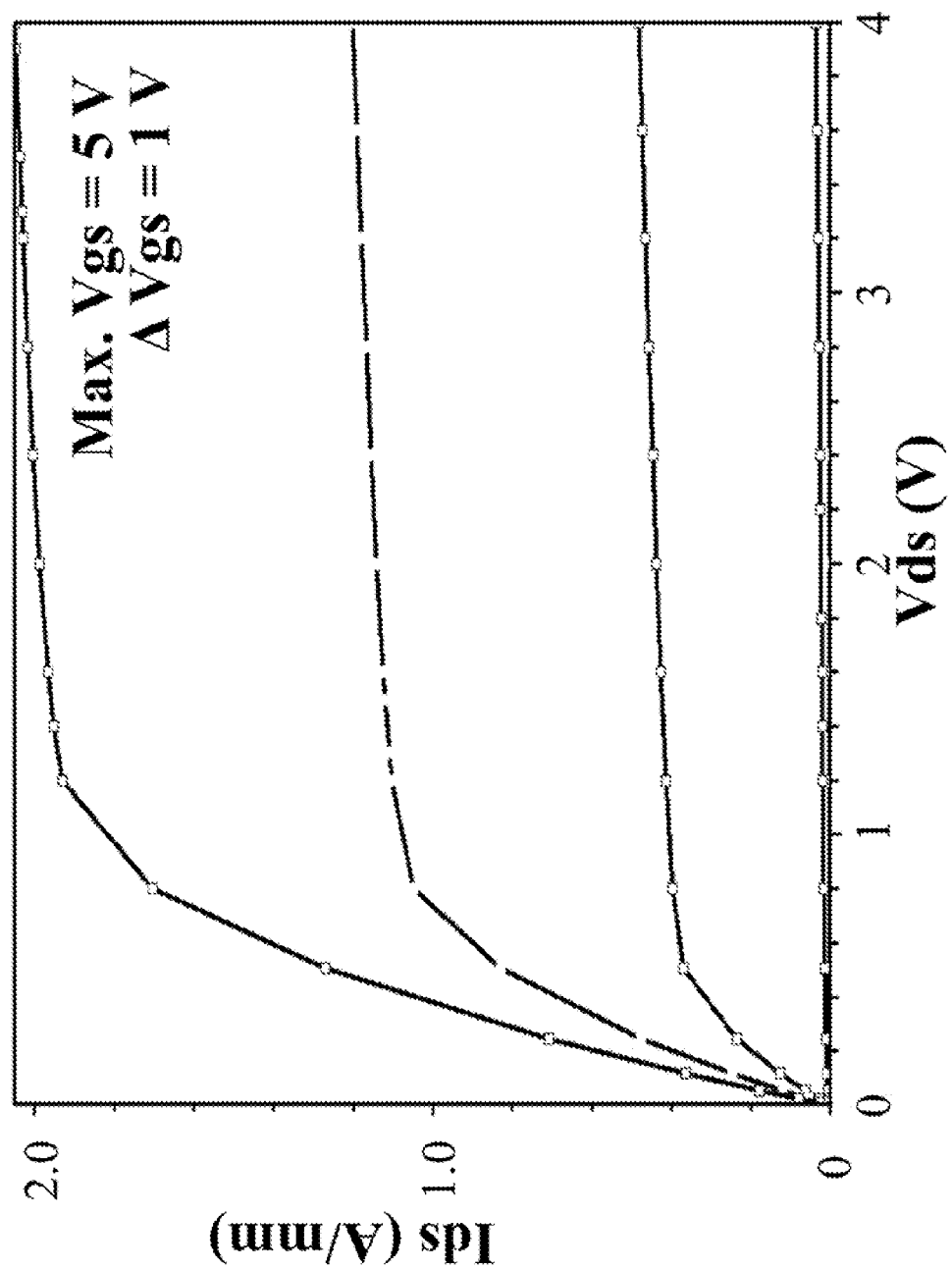
FIG. 9E is a graph the output characteristic of a single-gate double-channel HEMT device according to some embodiments of the invention.

FIG. 9D and FIG. 9E are graphs further illustrating the advantages of the single-gate double-channel HEMT. For example, one advantage lies in the small threshold voltage. As shown in FIG. 9D, the input characteristics demonstrate that the single-gate multiple-channel device has a threshold voltage of 0.22 V which is suitable for low voltage E-mode operation. Another advantage lies in the boost of the drive current. As shown in FIG. 9E, at low voltage bias (Vgs=5 V and Vds=4 V), the maximum normalized drain current of dual channel reaches about 2.1 A/mm which is almost two times of the conventional single channel device maximum current carrying capability under the same bias condition. The increase of the drive current is contributed by the introduction of inversion channel 450 in N-polar GaN stack in addition to the 2DEG channel 461 generated in Ga-polar stack.

Figure 9F:
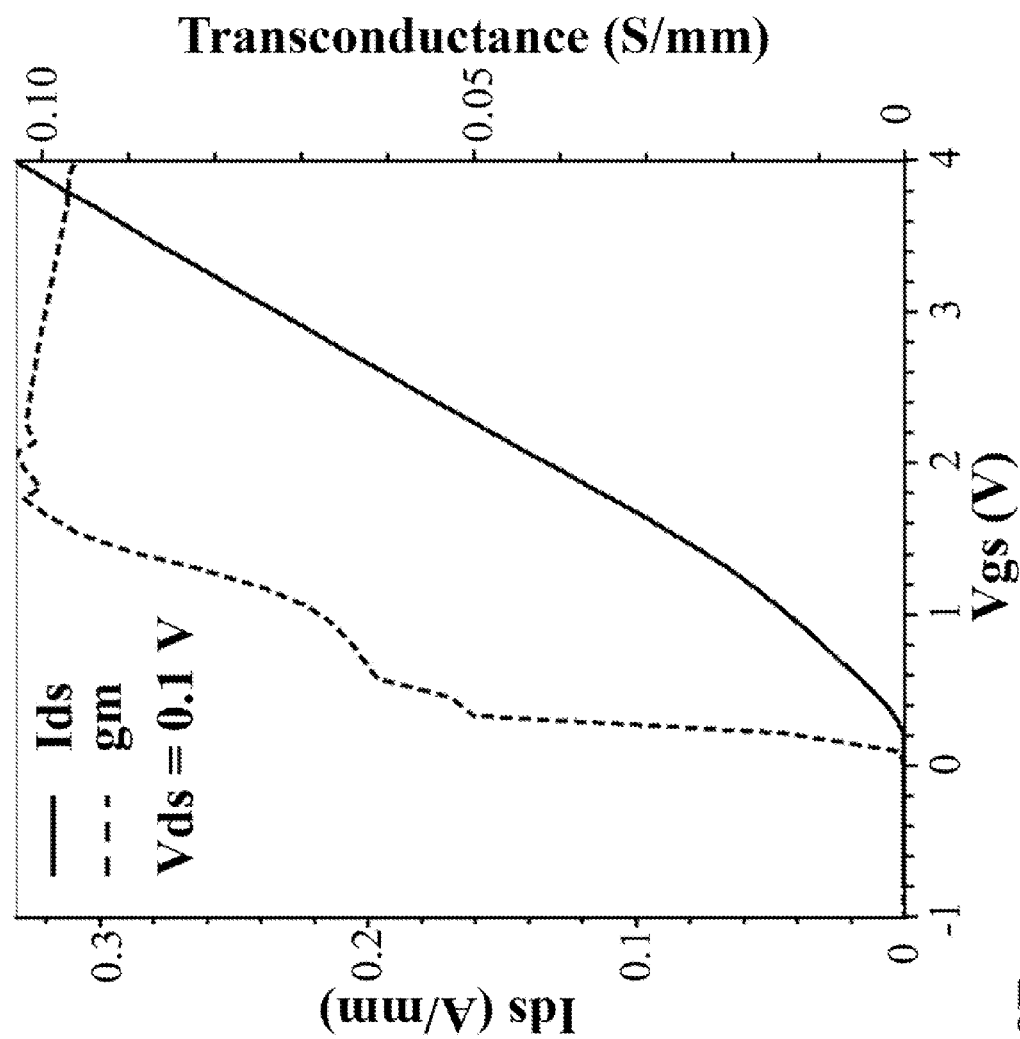
FIG. 9F is a graph the input characteristic of a single-gate multiple-channel HEMT device according to some embodiments of the invention.
Figure 9G:
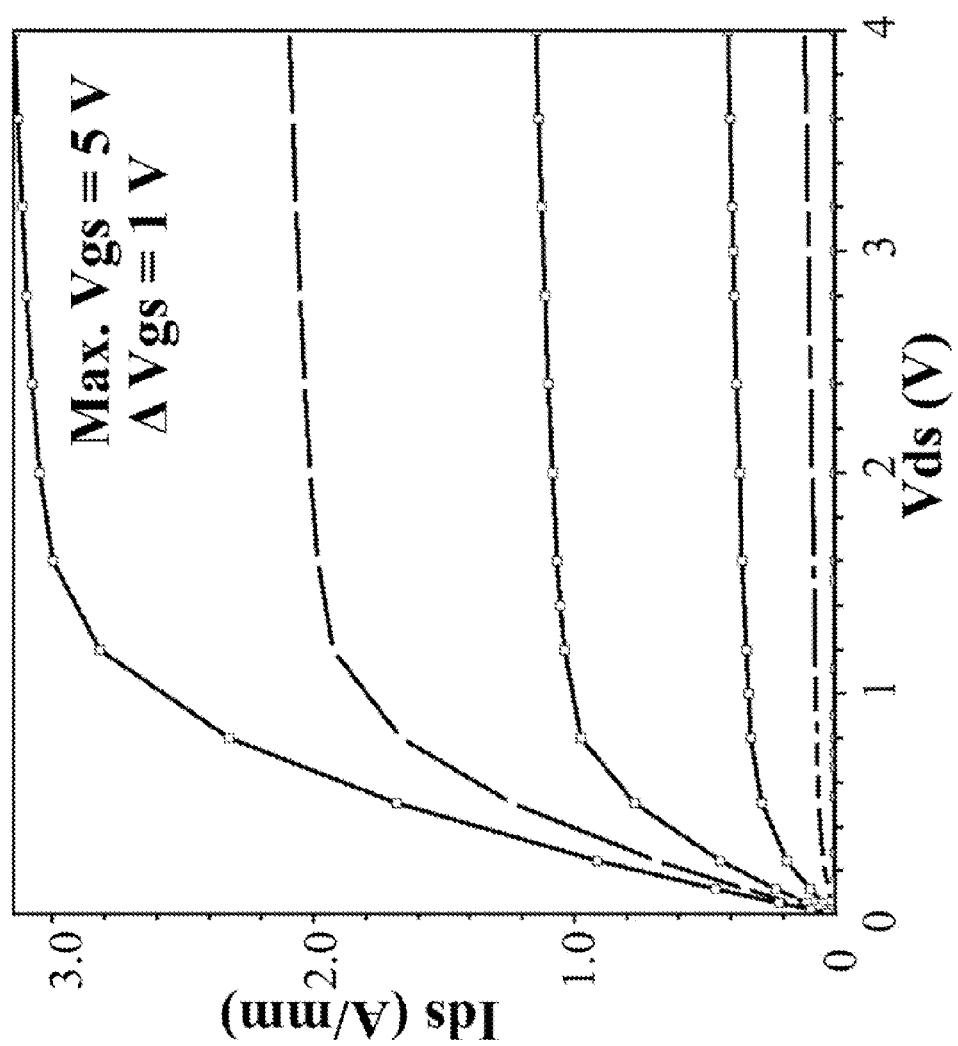
FIG. 9G is a graph of output characteristic of a single-gate multiple-channel HEMT device according to some embodiments of the invention.

FIG. 9F and FIG. 9G are graphs further illustrating the advantages of the single-gate multiple-channel HEMT. For example, one advantage lies in the small threshold voltage. As shown in FIG. 9F, the input characteristics demonstrate that the single-gate multiple-channel device has a threshold voltage of 0.24 V which is suitable for low voltage E-mode operation. Another advantage lies in the boost of the drain current. As shown in FIG. 9G, under low voltage bias (Vgs=5 V and Vds=4 V), the maximum normalized drain current of dual channels reaches about 3.2 A/mm, which is almost three times of the single channel device maximum current carrying capability under the same bias condition. The increase of the drive current is contributed by the double 2DEG channels 460 and 461 in both N-polar and Ga-polar GaN layers and the introduction of inversion channel 450 in N-polar GaN layer. It also should be pointed that within N-polar GaN layer 413, the thickness of N-polar GaN layer can be optimized to achieve confinement of each channel to minimize the carrier mobility degradation.

Although the invention has been described by way of examples of preferred embodiments, it is to be understood that various other adaptations and modifications can be made within the spirit and scope of the invention. Therefore, it is the object of the appended s to cover all such variations and modifications as come within the true spirit and scope of the invention.

We claim:

1. A device, comprising:
    a source for transmitting an electronic charge;
    a drain for receiving the electronic charge;
    a first stack for providing at least part of a conduction path between the source and the drain, wherein the first stack includes a first set of layers of a first polarity, the first set includes a first gallium nitride (GaN) layer of the first polarity;
    a second stack for providing at least part of the conduction path between the source and the drain, wherein the second stack includes a second set of layers of a second polarity, the second set includes a second gallium nitride (GaN) layer of the second polarity, and wherein the first polarity is different from the second polarity;
    an interlayer deposited between the first and the second stacks; and
    at least one gate operatively connected to at least the first stack for controlling a conduction of the electronic charge, such that, during an operation of the device, the conduction path includes a first two-dimensional electron gas (2DEG) channel formed in the first GaN layer and a second 2DEG channel formed in the second GaN layer.

2. The device of claim 1, wherein the interlayer includes aluminum nitride/aluminum oxide insulator.

3. The device of claim 1, wherein the interlayer includes a doping layer.

4. The device of claim 3, wherein the doping layer is formed by Magnesium+Nitride treatment.

5. The device of claim 1, wherein the at least one gate includes a first gate electrically connected to the first stack and a second gate electrically connected to the second stack.

6. The device of claim 1, wherein the first stack includes a N-polar barrier layer, N-polar GaN layer, and N-polar buffer layer, and wherein the second stack includes a Ga-polar barrier layer, Ga-polar GaN layer, and Ga-polar buffer layer.

7. The device of claim 1,
    wherein the first stack includes a Ga-polar buffer layer, a first Ga-polar barrier layer deposited on the Ga-polar buffer layer, a Ga-polar GaN layer deposited on the first Ga-polar barrier layer, a second Ga-polar barrier layer deposited on the Ga-polar GaN layer, and a first insulator layer deposited on the second Ga-polar barrier layer,
    wherein the second stack includes a second insulator layer, a first N-polar barrier layer deposited on the second insulator layer, a N-polar GaN layer deposited on the first N-polar barrier layer, the second N-polar barrier layer deposited on the N-polar GaN layer, and a N-polar GaN buffer deposited on the second N-polar barrier layer, and
    wherein the at least one gate includes a first gate electrically connected to the first stack and a second gate electrically connected to the second stack, wherein the first insulator layer of the first stack is arranged in proximity with the first gate, and
    wherein the second insulator layer of the second stack is arranged in proximity with the second gate.

8. The device of claim 7, wherein a thickness of the first insulator layer and a thickness of the second insulator layer is selected such that, during an operation of the device, the conduction path includes a first inversion carrier channel formed in the Ga-polar layer and a second inversion carrier channel formed in the N-polar layer.

9. The device of claim 7, wherein a thickness of the first insulator layer and a thickness of the second insulator layer are proportional to a dielectric constant of a material of the first and the second insulator layers.

10. The device of claim 7, wherein thicknesses of the first or the second insulator layers is selected such that a minimum voltage sufficient to create the first or the second 2DEG channel is also sufficient to create the first or the second inversion carrier channel.

* * * * *